(12) United States Patent
Osame

(10) Patent No.: US 7,483,013 B2
(45) Date of Patent: Jan. 27, 2009

(54) SEMICONDUCTOR CIRCUIT, DISPLAY DEVICE, AND ELECTRONIC APPLIANCE THEREWITH

(75) Inventor: Mitsuaki Osame, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 118 days.

(21) Appl. No.: 11/417,236

(22) Filed: May 4, 2006

(65) Prior Publication Data

US 2006/0262483 A1    Nov. 23, 2006

(30) Foreign Application Priority Data

May 20, 2005    (JP)    ............... 2005-148814

(51) Int. Cl.
*G09G 3/36*    (2006.01)
*H03K 19/00*    (2006.01)

(52) U.S. Cl. ........................ 345/100; 326/93
(58) Field of Classification Search ............... None
See application file for complete search history.

(56) References Cited

U.S. PATENT DOCUMENTS

| | | | |
|---|---|---|---|
| 4,920,282 A * | 4/1990 | Muraoka et al. ............ 327/218 |
| 5,136,622 A | 8/1992 | Plus | |
| 5,192,886 A | 3/1993 | Wetlaufer | |
| 5,973,533 A | 10/1999 | Nagaoka | |
| 6,759,701 B2 | 7/2004 | Shimizume | |
| 6,813,332 B2 | 11/2004 | Nagao et al. | |
| 6,870,895 B2 * | 3/2005 | Osame et al. ............... 377/78 |
| 6,909,417 B2 | 6/2005 | Washio et al. | |
| 7,002,545 B2 | 2/2006 | Osame | |
| 7,057,598 B2 | 6/2006 | Azami et al. | |
| 7,116,748 B2 | 10/2006 | Nagao et al. | |

| 2003/0012330 A1 | 1/2003 | Osame | |
|---|---|---|---|
| 2003/0174115 A1 * | 9/2003 | Washio et al. ............ 345/98 |

(Continued)

FOREIGN PATENT DOCUMENTS

EP    0 447 219    9/1991

(Continued)

OTHER PUBLICATIONS

European Search Report (Application No. 06009466.1) dated Sep. 15, 2006.

*Primary Examiner*—Rexford Barnie
*Assistant Examiner*—Dylan White
(74) *Attorney, Agent, or Firm*—Eric J. Robinson; Robinson Intellectual Property Law Office, P.C.

(57) ABSTRACT

It is an object of the invention to provide a semiconductor circuit requiring less number of transistors included in the semiconductor circuit and accurately serving as a shift register without providing a level shifter. The semiconductor circuit includes: an m (m is an arbitrary positive integer, $m \geq 3$) stage of a circuit group having a p-channel transistor, in which a first terminal is connected to a high potential power source, and an n-channel transistor, in which a first terminal is connected to a low potential power source; and an inverter circuit. A clock signal is input to a gate of the n-channel transistor in the $(2n-1)$th stage (n is an arbitrary integer, $m \geq 2n \geq 2$). An inverted clock signal is input to a gate of the n-channel transistor in the 2n-th stage (n is an arbitrary integer, $m \geq 2n \geq 2$).

22 Claims, 27 Drawing Sheets

U.S. PATENT DOCUMENTS

| | | |
|---|---|---|
| 2004/0061542 A1 | 4/2004 | Osame et al. |
| 2004/0174189 A1* | 9/2004 | Nagao et al. .................. 326/97 |
| 2004/0183766 A1* | 9/2004 | Koyama et al. ............... 345/89 |
| 2004/0202276 A1 | 10/2004 | Osame et al. |
| 2005/0134325 A1 | 6/2005 | Osame et al. |
| 2006/0082535 A1* | 4/2006 | Osame ....................... 345/98 |
| 2006/0202940 A1 | 9/2006 | Azami et al. |
| 2006/0233293 A1 | 10/2006 | Osame et al. |
| 2006/0280279 A1 | 12/2006 | Nagao et al. |

FOREIGN PATENT DOCUMENTS

| | | |
|---|---|---|
| EP | 1 056 069 | 11/2000 |
| EP | 1 280 162 | 1/2003 |
| JP | 2000-339984 | 12/2000 |
| JP | 2000-339985 | 12/2000 |
| JP | 2003-141893 | 5/2003 |
| WO | WO2005/122178 | 12/2005 |

* cited by examiner

FIG. 4A  T0 period (S0: high level, CK: high level)
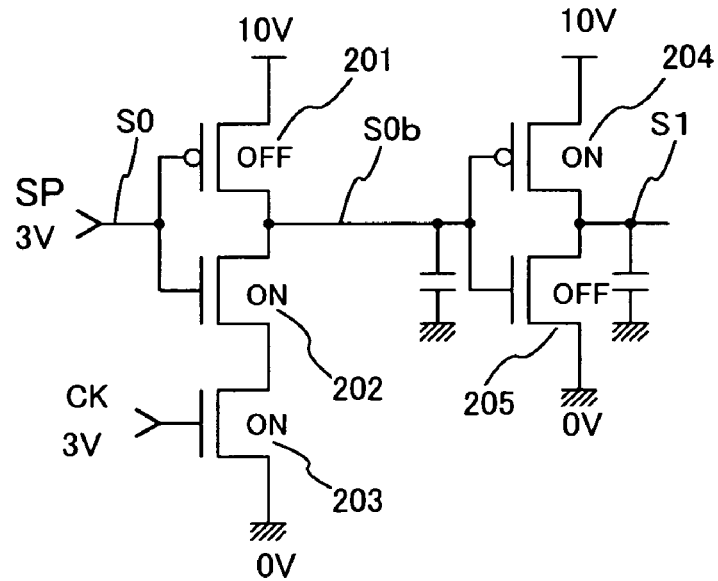
FIG. 4B  T1 peiriod (S0: low level, CK: low level)
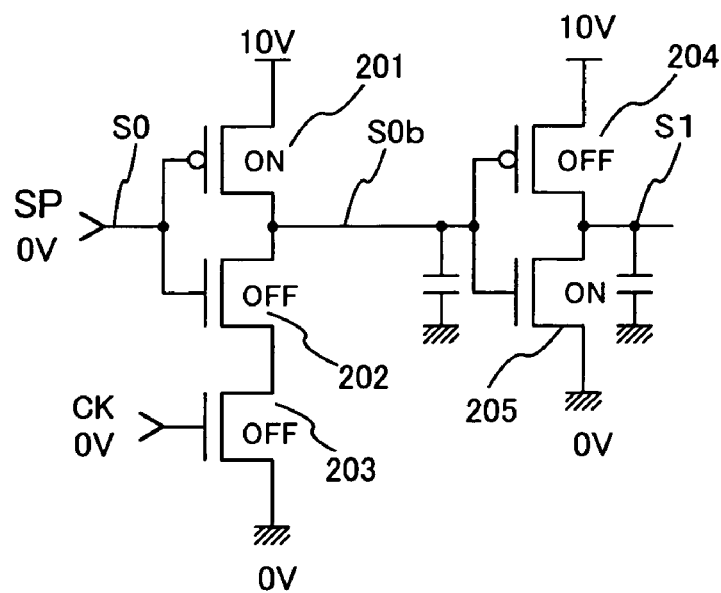

FIG. 5A  T2 period (S0: low level, CK: high level)
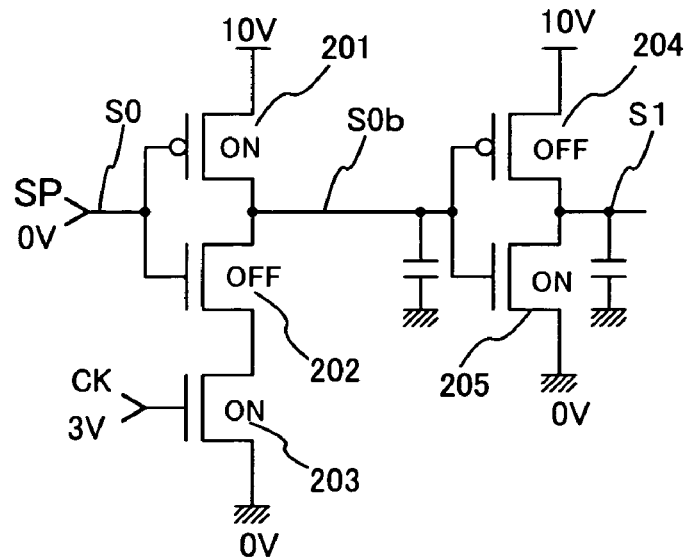
FIG. 5B  T2 period (S0: high level, CK: low level)
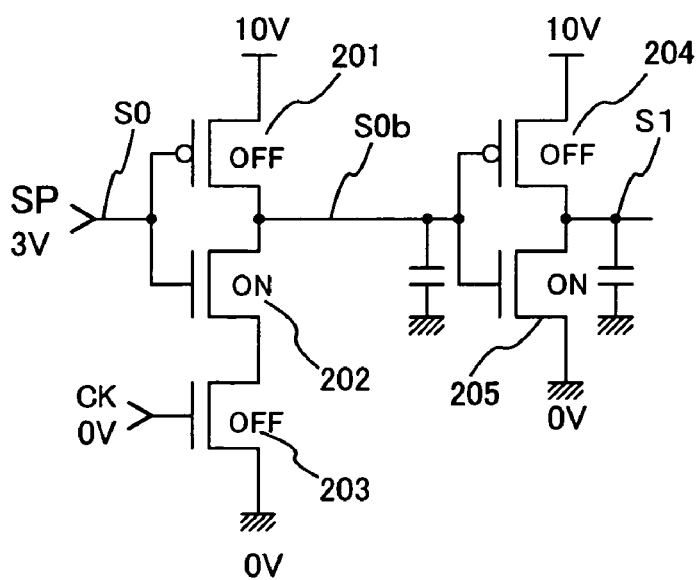

FIG. 9A  T0 period (S0: high level, CK: high level)
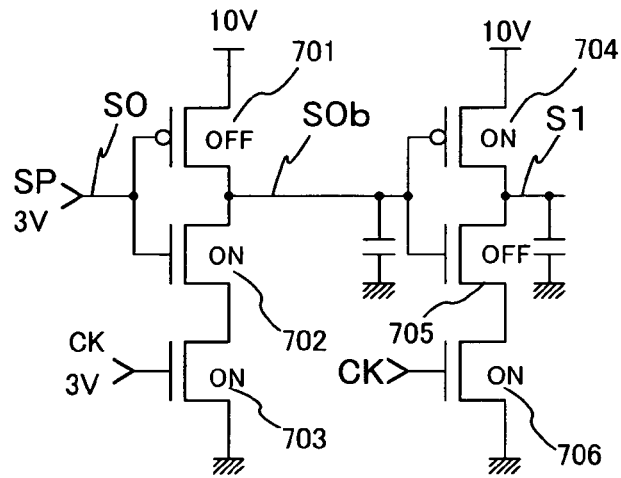
FIG. 9B  T1 period (S0: low level, CK: low level)
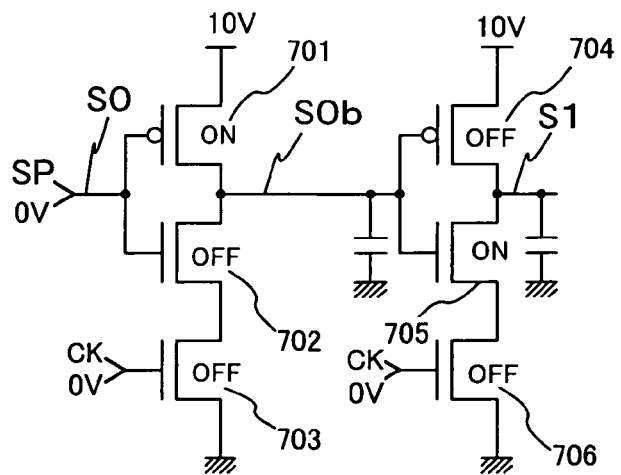

FIG. 10A  T0 period (S0: high level, CK: high level)
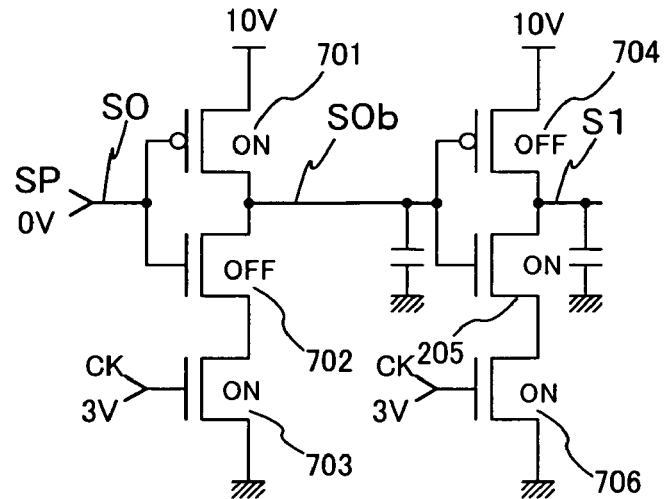
FIG. 10B  T1 period (S0: low level, CK: low level)
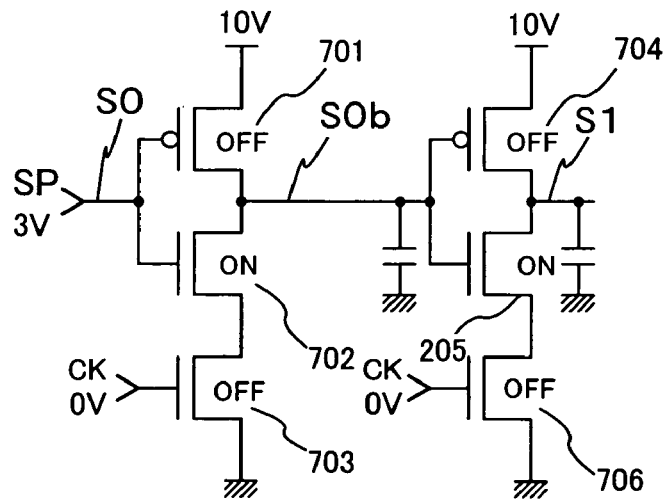

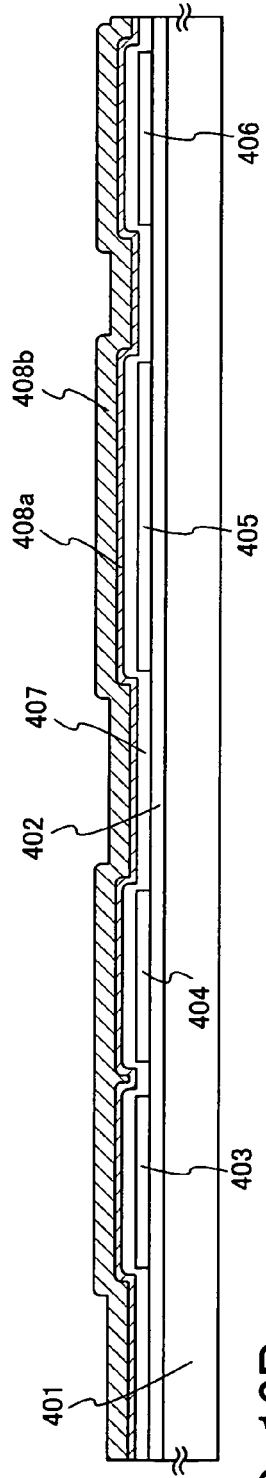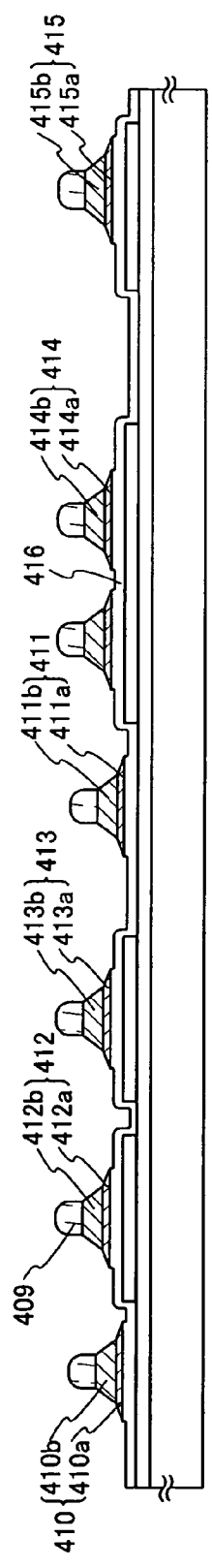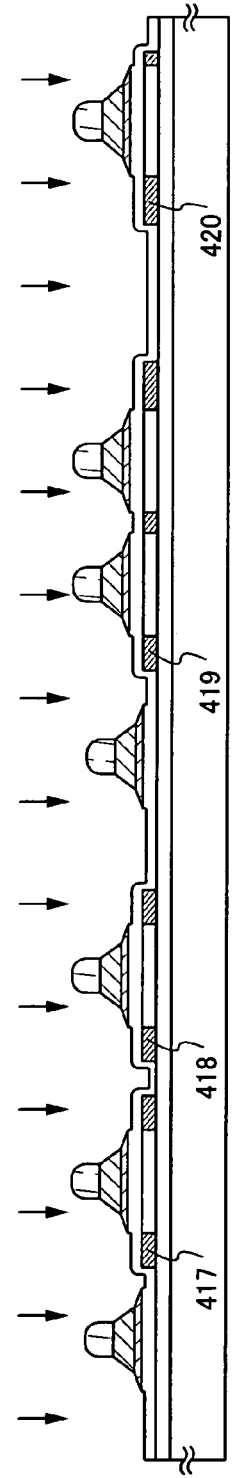

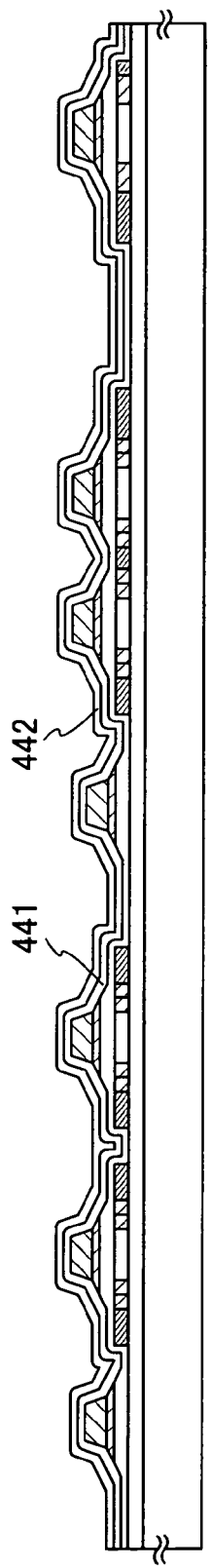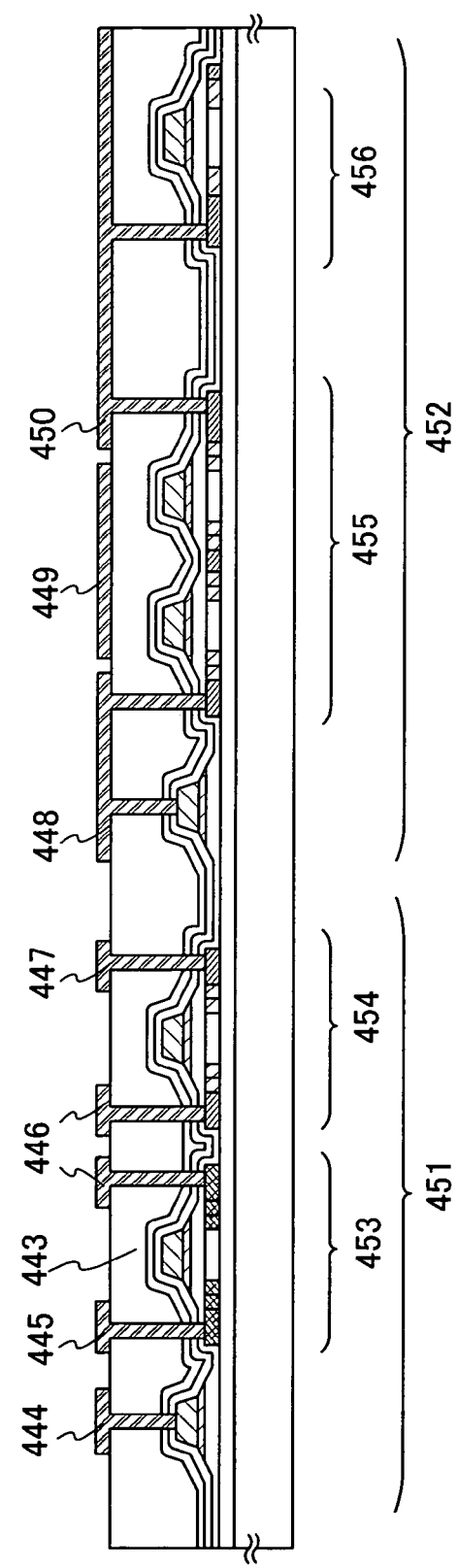
FIG. 14A
FIG. 14B

SEMICONDUCTOR CIRCUIT, DISPLAY DEVICE, AND ELECTRONIC APPLIANCE THEREWITH

BACKGROUND OF THE INVENTION

1. Field of the Invention

The present invention relates to a semiconductor circuit, and in particular, relates to a shift register including a transistor. Moreover, the present invention relates to a display device including a semiconductor circuit and an electronic appliance including the display device.

Note that a semiconductor circuit mentioned in this specification indicates overall circuits which can work by utilizing semiconductor characteristics.

2. Description of the Related Art

In recent years, development of display devices such as a liquid crystal display device and a light emitting device have been actively carried out in accordance with increase in demand for portable apparatuses. In particular, a technique for forming a pixel circuit and driver circuits (hereinafter, referred to as internal circuits) including a shift register circuit and the like by using transistors formed using a polycrystalline semiconductor over an insulator, greatly contributes to miniaturization and reduction in power consumption, and therefore, this technique has been actively developed. The internal circuits formed over the insulator are connected to a controller IC and the like (hereinafter, referred to as external circuits) through an FPC and the like so that operation of the internal circuits are controlled.

As a shift register circuit constituting part of a conventional internal circuit, a shift register circuit including shift registers using clocked inverters is shown in each of FIG. 25 and FIG. 26. The shift register circuit shown in FIG. 25 includes n (n is an integer equal to or more than 3) stages of shift registers. Shift registers of 4 stages among the n stages of the shift registers are shown here. In FIG. 25, a single shift register includes a clock signal CK, an inverted clock signal CKb, a first clocked inverter CKINV1, a second clocked inverter CKINV2, an inverter INV, and an input signal SP. Further, in FIG. 25, a shift register in the i-th (i is a natural number equal to or less than n) stage is denoted by SRi.

In FIG. 26, only shift registers (SR1 and SR2) of 2 stages among the shift registers shown in FIG. 25 are denoted by transistors. In the shift register SR1 in the first stage, a first clocked inverter CKINV1 includes p-channel transistors 2501$a$ and 2501$b$, and n-channel transistors 2501$c$ and 2501$d$. A second clocked inverter CKINV2 includes p-channel transistors 2502$a$ and 2502$b$, and n-channel transistors 2502$c$ and 2502$d$. An inverter INV includes a p-channel transistor 2503$a$ and an n-channel transistor 2503$b$. A specific description about the shift register SR2 in the second stage is omitted in this specification. As shown in FIG. 26, in the shift register SR2, signals (CK, CKb, and the like) to be input are inverted.

FIG. 27 shows a timing chart explaining a method for driving the shift registers having the structures shown in FIG. 25 and FIG. 26.

To provide a simple explanation, power supply voltage of a shift register (an internal circuit) is set to be 10 V (high potential power source Vdd is set to be 10 V and low potential power source Vss is set to be 0 V), and amplitude voltage of a pulse signal such as a click signal CK, an inverted clock signal CKb, or an input signal, which are input from an external circuit, is set to be 3 V (a high potential level (which is also referred to as an H level, H potential, or H) and a low potential level (which is also referred to as an L level, L potential, or L) is set to be 0 V). An IC constituting part of an external circuit is operated at lower power supply potential than the internal circuit.

The first clocked inverter CKINV1 will be specifically described. In the p-channel transistor 2501$a$, a case where a source of the p-channel transistor 2501$a$ is input with 10 V of the high potential power source Vdd and a gate of the p-channel transistor 2501$a$ is input with 3 V, which is H potential of a clock pulse CK or an inverted clock pulse CKB, i.e., a case where the H potential is input to the gate of the p-channel transistor to turn the p-channel transistor off, will be described. In this case, a potential difference between the gate and the source of the p-channel transistor 2501$a$ is 7 V. If an absolute value of threshold voltage of the p-channel transistor 2501$a$ is lower than 7 V, the p-channel transistor 2501$a$ is remained turned on so that a conduction state is made between the source and the drain. Therefore, since the p-channel transistor, which is normally required to be remained turned off, is remained turned on, output in the shift register is not normally performed (see a dashed line 2701 in FIG. 27), and hence, there is a high probability of causing malfunction (see patent document 1).

Further, in order to prevent the malfunction due to the above reason, in a conventional shift register, after amplitude voltage of a pulse signal such as a clock pulse CK or a start pulse SP is increased to be almost equal to power supply voltage of the shift register through a level shifter, the pulse signal is input. For example, in order to operate an internal circuit accurately by using a signal with amplitude of about 3 V of an external circuit, there is a shift register circuit having a structure in which a level shift portion is disposed in each stage (e.g., see patent document 2).

[Patent Document 1]: Japanese Patent Application Laid-Open No. 2003-141893

[Patent Document 2]: Japanese Patent Application Laid-Open No. 2000-339985

There is a case where a threshold value of a transistor is varied due to variations in length and width of a gate and variations in thickness of a gate insulating film or the like, which are caused due to differences in manufacturing processes and substrates to be used, so that the threshold value is different from an expected value. In this case, when a signal with small amplitude is used in a digital circuit using two logic levels of "1" and "0", the digital circuit is sometimes not operated accurately due to an adverse influence of variations in threshold value.

In an active matrix display device, the number of transistors is increased in the above described shift register circuit with increase in rows and columns of a pixel portion. Therefore, there is a problem that the yield attributable to variations in transistors with increase in the number of transistors is degraded.

SUMMARY OF THE INVENTION

It is an object of the present invention to provide a semiconductor circuit, which accurately serves as a shift register, while reducing an adverse influence of variations in characteristics of transistors. In view of the above mentioned problems, the present invention proposes a semiconductor circuit using a small amplitude signal, which preferably serves as a shift register, without increasing the number of transistors.

Further, when level shifters are disposed in an internal circuit, problems of reducing frequency characteristics and the like are caused due to increase in an occupation area of a driver circuit and a delayed or dull waveform.

Accordingly, in view of the above circumference, it is another object of the present invention to realize miniaturization of a housing, reduction in manufacturing cost, and reduction in power consumption. Moreover, it is still another object of the present invention to provide a semiconductor circuit, which can favorably serve as a shift register without providing a level shifter in an internal circuit, so as to solve a problem of a delayed or dull waveform of a clock signal and a problem of a voltage drop of a power source line provided in the internal circuit, thereby realizing reduction in an occupation area of a driver circuit of the internal circuit, reduction in power consumption, and high frequency operation.

In an aspect of the present invention, a semiconductor circuit has an m (m is an arbitrary positive integer, $m \geq 3$) stage of a circuit group and an inverter circuit. The circuit group includes: a p-channel transistor having a first terminal connected to a high potential power source; a first n-channel transistor having a gate connected to a gate of the p-channel transistor and a first terminal connected to a second terminal of the p-channel transistor; and a second n-channel transistor having a first terminal connected to a second terminal of the first n-channel transistor and a second terminal connected to a low potential power source. An input terminal of the inverter circuit is connected to the second terminal of the p-channel transistor and the first terminal of the first n-channel transistor. A clock signal is input to a gate of a second n-channel transistor in the (2n−1)th (n is an arbitrary integer, $m \geq 2n \geq 2$) stage. An inverted clock signal is input to a gate of a second n-channel transistor in the 2n-th stage.

In another aspect of the present invention, a semiconductor circuit has an m (m is an arbitrary positive integer, $m \geq 3$) stage of a circuit group and an inverter circuit. The circuit group includes: a p-channel transistor having a first terminal connected to a high potential power source; a first n-channel transistor having a gate connected to a gate of the p-channel transistor and a first terminal connected to a second terminal of the p-channel transistor; and a second n-channel transistor having a first terminal connected to a second terminal of the first n-channel transistor and a second terminal connected to a low potential power source. An input terminal of the inverter circuit is connected to the second terminal of the p-channel transistor and the first terminal of the first n-channel transistor. A clock signal is input to a gate of a second n-channel transistor in the (2n−1)th (n is an arbitrary integer, $m \geq 2n \geq 2$) stage. An inverted clock signal is input to a gate of a second n-channel transistor in the 2n-th stage. A high potential level of each of the clock signal and the inverted clock signal is the same as potential of the high potential power source, and a low potential level is higher than potential of the low potential power source.

Further, the semiconductor circuit of the present invention may have a means for holding potential between the circuit group and the inverter circuit.

Furthermore, the semiconductor circuit of the present invention may have an NAND circuit in which the gate of the p-channel transistor and the gate of the first n-channel transistor are connected, and the second terminal of the p-channel transistor and the first terminal of the first n-channel transistor are connected.

In another aspect of the present invention, a semiconductor circuit has an m (m is an arbitrary positive integer, $m \geq 3$) stage of a first circuit group and a second circuit group. The first circuit group includes: a first p-channel transistor having a first terminal connected to a high potential power source; a first n-channel transistor having a gate connected to a gate of the first p-channel transistor and a first terminal connected to a second terminal of the first p-channel transistor; and a second n-channel transistor having a first terminal connected to a second terminal of the first n-channel transistor and a second terminal connected to a low potential power source. The second circuit group includes: a second p-channel transistor having a first terminal connected to a high potential power source; a third n-channel transistor having a gate connected to the second terminal of the first p-channel transistor, the first terminal of the first n-channel transistor, and a gate of the second p-channel transistor, and a first terminal connected to a second terminal of the second p-channel transistor; and a fourth n-channel transistor having a first terminal connected to a second terminal of the third n-channel transistor and a second terminal connected to a low potential power source. A clock signal is input to a gate of a second n-channel transistor and a gate of a fourth n-channel transistor in the (2n−1)th (n is an arbitrary integer, $m \geq 2n \geq 2$) stage. An inverted clock signal is input to a gate of a second n-channel transistor and a gate of a fourth n-channel transistor in the 2n-th stage.

In another aspect of the present invention, a semiconductor circuit has an m (m is an arbitrary positive integer, $m \geq 3$) stage of a first circuit group and a second circuit group. The first circuit group includes: a first p-channel transistor having a first terminal connected to a high potential power source; a first n-channel transistor having a gate connected to a gate of the first p-channel transistor and a first terminal connected to a second terminal of the first p-channel transistor; and a second n-channel transistor having a first terminal connected to a second terminal of the first n-channel transistor and a second terminal is connected to a low potential power source. The second circuit group includes: a second p-channel transistor having a first terminal connected to a high potential power source; a third n-channel transistor having a gate connected to the second terminal of the first p-channel transistor, the first terminal of the first n-channel transistor, and a gate of the second p-channel transistor, and a first terminal connected to a second terminal of the second p-channel transistor; and a fourth n-channel transistor having a first terminal connected to a second terminal of the third n-channel transistor, and a second terminal connected to a low potential power source. A clock signal is input to a gate of a second n-channel transistor and a gate of a fourth n-channel transistor in the (2n−1)th (n is an arbitrary integer, $m \geq 2n \geq 2$) stage. An inverted clock signal is input to a gate of a second n-channel transistor and a gate of a fourth n-channel transistor in the 2n-th stage. A high potential level of each of the clock signal and the inverted clock signal is the same as potential of the high potential power source, and a low potential level of each of the clock signal and the inverted clock signal is higher than potential of the low potential power source.

The semiconductor circuit of the present invention may have a means for holding potential between the first circuit group and the second circuit group.

Furthermore, the semiconductor circuit of the present invention may have an NOR circuit in which the gate of the p-channel transistor and the gate of the first n-channel transistor are connected, and the second terminal of the second p-channel transistor and the first terminal of the third n-channel transistor are connected.

In the semiconductor circuit of the present invention, the n-channel transistors and the p-channel transistors may be formed using thin film transistors formed over a glass substrate.

In the semiconductor circuit of the present invention, the n-channel transistors and the p-channel transistors may be formed over a single crystalline substrate.

A display device including the semiconductor circuit of the present invention may use either a liquid crystal element or an EL element.

Further, an electronic appliance using a display device including the semiconductor circuit of the present invention may be a television receiver, a camera such as a video camera or a digital camera, a goggle type display, a navigation system, an audio reproducing device, a computer, a game machine, a mobile computer, a mobile phone, a portable game machine, an electronic book, and an image reproducing device.

According to the present invention, a shift register circuit including a semiconductor circuit of the present invention is accurately operated even with a clock signal having amplitude which is smaller than a potential difference between a high potential power source and a low potential power source, which drive the shift register circuit, and hence, high frequency operation can be realized.

According to the present invention, power consumption of a shift register circuit including the semiconductor circuit of the present invention can be reduced while preventing through current from flowing between the high potential power source and the low potential power source.

According to the present invention, the number of transistors required for a sift register circuit including the semiconductor circuit of the present invention can be reduced as compared with a conventional shift register circuit, and therefore, high yield can be provided.

According to the present invention, a shift register circuit including the semiconductor device of the present invention can be operated without providing a level shift portion so that an occupation area of the shift register circuit over a substrate can be reduced.

Further, in a display device using the semiconductor circuit of the present invention, which serves as a shift register circuit, the semiconductor circuit properly serves as the shift register circuit even with a clock signal whose amplitude is smaller than a potential difference between a high potential power source and a low potential power source, which drive a shift register. Therefore, it is possible to provide a display device including the semiconductor circuit which can realize high frequency operation.

Further, in a display device using the semiconductor circuit of the present invention, which serves as a shift register circuit, power consumption can be reduced while preventing through current from flowing between a high potential power source and a low potential power source.

Further, it is possible to provide a display device using the semiconductor device of the present invention, which serves as a shift register circuit, in which high yield can be obtained since the semiconductor circuit requires less number of transistors than a conventional shift register circuit.

Further, it is possible to provide a further miniaturized display device using the semiconductor circuit of the present invention, which serves as a shift register circuit, in which the semiconductor circuit can be operated without providing a level shift portion so that an occupation area of the semiconductor circuit serving as the shift register over a substrate can be reduced.

Furthermore, it is possible to provide an electronic appliance including the semiconductor circuit of the present invention, which serves as a shift register circuit, to a customer, in which the semiconductor circuit serves as the shift register circuit accurately even when using a clock signal with smaller amplitude than a potential difference between a high potential power source and a low potential power source so that high frequency operation can be realized.

It is possible to provide an electronic appliance including the semiconductor circuit of the present invention, which serves as a shift register circuit, to a customer, in which power consumption can be reduced while preventing through current from flowing between a high potential power source and a low potential power source.

In an electronic appliance including the semiconductor circuit of the present invention, which serves as a shift register circuit, the semiconductor circuit requires less number of transistors than a conventional shift register circuit, thereby providing a less expensive product with high yield to a customer.

Moreover, in an electronic appliance including the semiconductor circuit of the present invention, which serves as a shift register circuit, the semiconductor circuit can be operated without providing a level shift portion, so that an occupation area of the semiconductor circuit, which serves as a shift register, over a substrate can be reduced. Therefore, reduction in layout area of a display portion can be realized so that miniaturization and reduction in weight of an electronic appliance can be realized.

BRIEF DESCRIPTION OF DRAWINGS

FIGS. 4A and 4B are diagrams explaining an operation of a structure of Embodiment Mode 1;

FIGS. 5A and 5B are diagrams explaining an operation of a structure of Embodiment Mode 1;

FIGS. 9A and 9B are diagrams explaining an operation of a structure of Embodiment Mode 2;

FIGS. 10A and 10B are diagrams explaining an operation of a structure of Embodiment Mode 2;

FIGS. 12A to 12C are cross sectional views showing steps of manufacturing a transistor of Embodiment 2;

FIGS. 14A and 14B are cross sectional views of steps of manufacturing a transistor of Embodiment 2;

DETAILED DESCRIPTION OF THE INVENTION

Embodiment Mode

Figure 1:
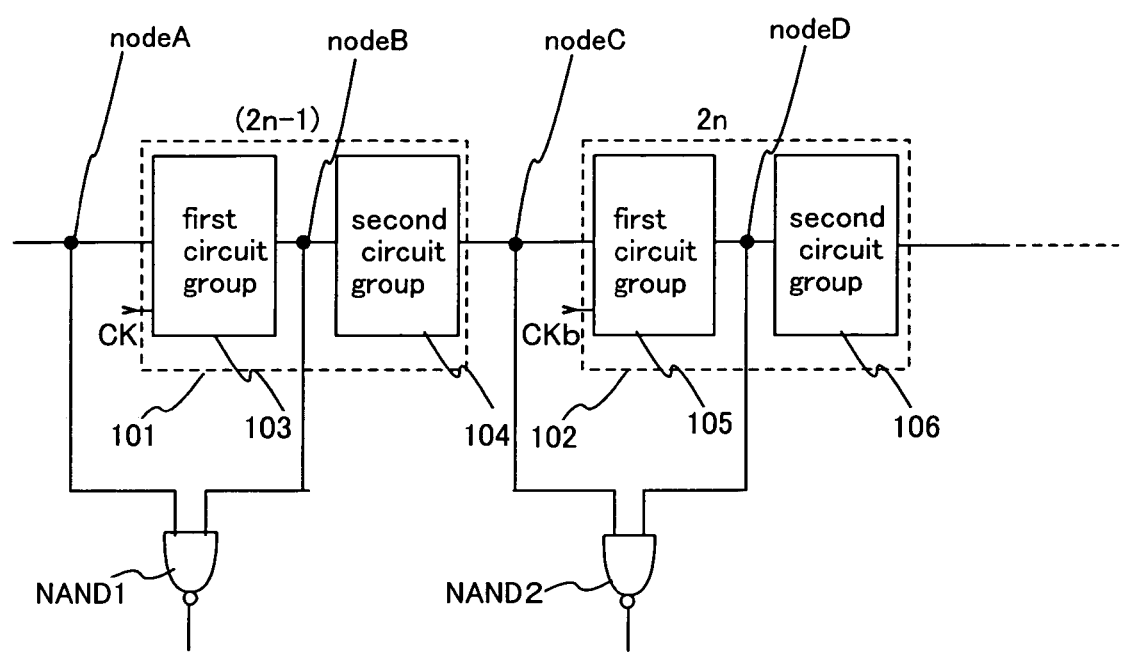
FIG. 1 is a block diagram showing a structure of Embodiment Mode 1.

The embodiment modes of the present invention will be described below with the accompanying drawings. The present invention can be implemented in may different modes. It is easily understood by those who skilled in the art that the embodiment modes and details herein disclosed can be modified in various ways without departing from the purpose and the scope of the invention. The present invention should not be interpreted as being limited to the description of the embodiment modes to be given below. Further, the same portions and portions having similar functions are denoted by the same reference numerals, and explanations thereof will be omitted.

Embodiment 1

FIG. 1 shows one embodiment mode of a semiconductor circuit, which serves as a shift register of the present invention. In FIG. 1, a register (a first register) 101 in the (2n−1)th (n is an arbitrary integer and m≧2n≧2, wherein m is the total number of stages provided in the shift register) stage, and a register (a second register) 102 in the 2n-th stage are shown. The register 101 includes a first circuit group 103 and a second circuit group 104. The register 102 includes a first circuit group 105 and a second circuit group 106. In the register 101 in the (2n−1)th stage, a clock signal is input to the first circuit group 103. Further, in the register 102 in the 2n-th stage, an inverted clock signal CKb is input to the first circuit group 105. Further, in a node A inputting a signal to the register 101 in the the (2n−1)th stage, a node B provided between the first circuit group and the second circuit group of the shift register 101 in the (2n−1)th stage, a node C inputting a signal to the register 102 in the 2n-th stage, and a node D provided between the first circuit group and the second circuit group of the register 102 in the 2n-th stage, an NAND circuit 1 (NAND1) being connected to the node A and the node B is provided to obtain inverted AND of the node A and the node B whereas an NAND circuit 2 (NAND2) being connected to the node C and the node D is provided to obtain inverted AND of the node C and the node D. Of course, other logic element may be arbitrarily disposed to be connected to other node in accordance with a signal desired to be output.

Figure 2:
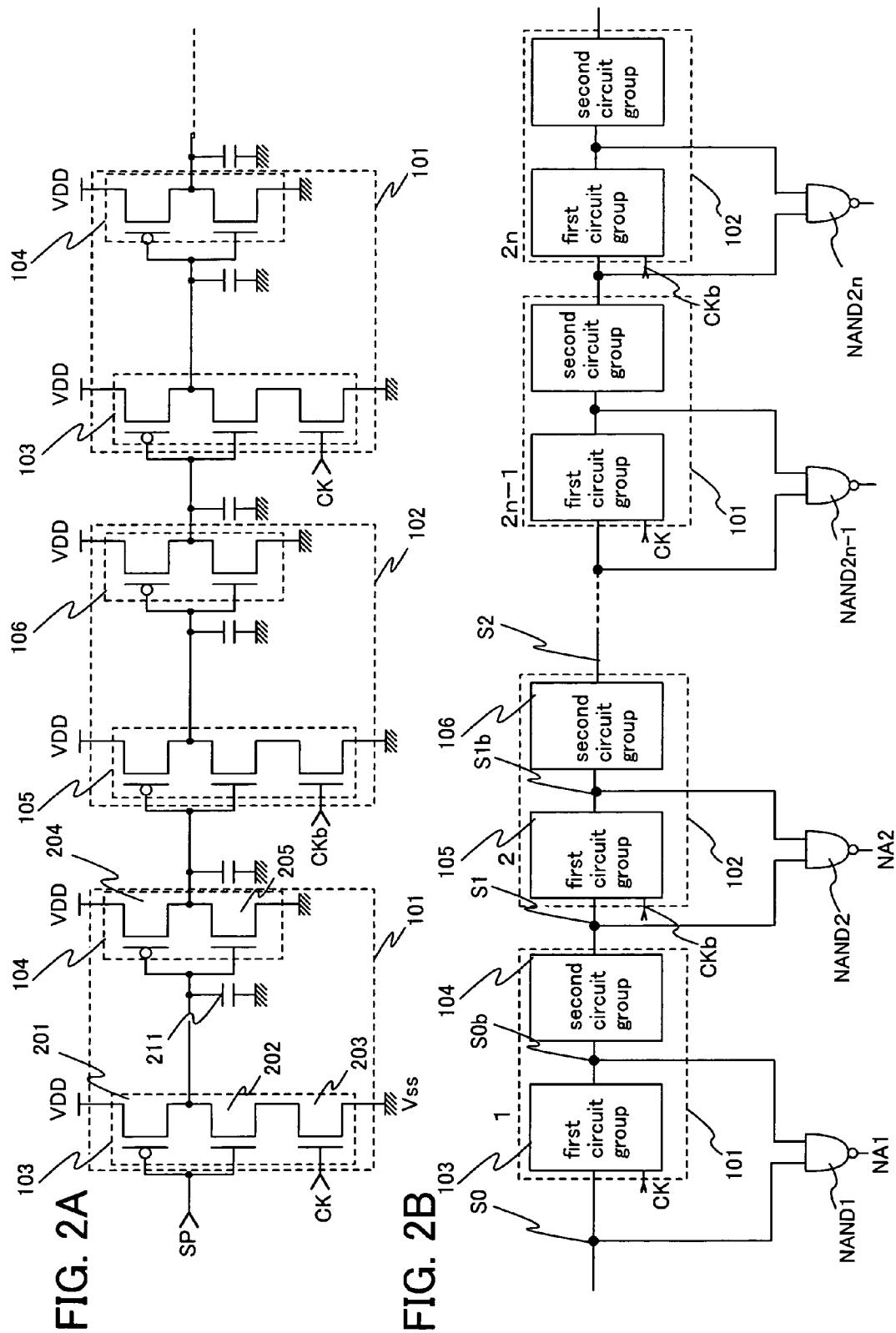
FIGS. 2A and 2B are circuit diagrams showing a structure of Embodiment Mode 1.

Further, a specific circuit structure of a semiconductor circuit, which serves as a shift register of the present invention of this embodiment mode, is shown in FIG. 2A. In FIG. 2A, as the first circuit group 103 constituting part of the first register 101, a p-channel transistor 201, a first n-channel transistor 202, and a second n-channel transistor 203 are provided. As the second circuit group 104 constituting part of the first register 101, an inverter circuit is provided, wherein an p-channel transistor 204 and an n-channel transistor 205 are provided. In the second register, a plurality of transistors having the same structure are provided.

In FIG. 2A, a first terminal of the p-channel transistor 201 is connected to a high potential power source Vdd, a second terminal of the p-channel transistor 201 is connected to a first terminal of the first n-channel transistor 202, a second terminal of the first n-channel transistor 202 is connected to a first terminal of the second n-channel transistor 203, and a second terminal of the second n-channel transistor 203 is connected to a low potential power source (Vss or GND). Further, the second terminal of the p-channel transistor 201 and the first terminal of the first n-channel transistor 202 are connected to an input terminal of an inverter circuit. Further, an input signal SP is input to a gate of the p-channel transistor 201 and a gate of the first n-channel transistor 202, and an output signal is output from an output terminal of the inverter circuit.

Further, FIG. 2A shows a structure in which a hold capacitor 211 is provided between the first circuit group and the second circuit group; however, the hold capacitor is not necessary to be provided. In a case where the hold capacitor is not provided, parasitic capacitance of each transistor may be used. Further, a circuit which can hold potential may be connected without being limited to the capacitor.

Further, in the present invention, two electrodes serving as a source and a drain, which are included in a single transistor, is determined whether any one of the two electrodes serves as the source or drain depending on a potential difference generated between these electrodes. Accordingly, it is difficult to define whichever electrode serves as a source or a drain. Therefore, in this specification, the two electrodes serving as a source and a drain are denoted by a first terminal and a second terminal.

In FIG. 2A, a clock signal CK is input to a gate of a second n-channel transistor 203 of a first register 101 provided in the (2n−1)th (n is an arbitrary integer and m≧2n≧2) stage. Further, an inverted clock signal CKb is input to a gate of a second n-channel transistor 203 of a second register 102 provided in the 2n-th (n is an arbitrary integer and m≧2n≧2) stage.

In this embodiment mode, even when a high potential level (also referred to as an H level, H potential, or H) of a clock signal (or an inverted clock signal) to be input is set lower than potential of the high potential power source and a low potential level (also referred to as an L level, L potential, or L) thereof is set to be equal to potential of the low potential power source, the semiconductor circuit serves as a shift register without problems. Therefore, amplitude of a clock signal can be reduced, making it possible to reduce power consumption.

Next, each node shown in FIG. 2B will be described to explain a timing chart in the semiconductor circuit of the present invention, which serves as a shift register, in this embodiment mode. In FIG. 2B, in the first register 101, a node corresponding to the gate of the p-channel transistor 201 and the gate of the first n-channel transistor 202 is denoted by S0. Further, in the first register 101, a node corresponding to the second terminal of the p-channel transistor 201 and the first terminal of the first n-channel transistor 202 or the input terminal of the inverter circuit, is denoted by S0b. Further, a node corresponding to an output terminal of the inverter circuit of the first register 101 or the gate of the p-channel transistor 201 and the gate of the first n-channel transistor 202 of the second register 102 is denoted by S1. Further, in the second register 102, a node corresponding to the second terminal of the p-channel transistor 201 and the first terminal of the first n-channel transistor 202 or the input terminal of the inverter circuit, is denoted by S1b. A node corresponding to the output terminal of the inverter circuit of the second register 102, is denoted by S2. Further, a node of an output terminal of the NAND1 is denoted by NA1 and a node of an output terminal of the NAND2 is denoted by NA2.

Figure 3:
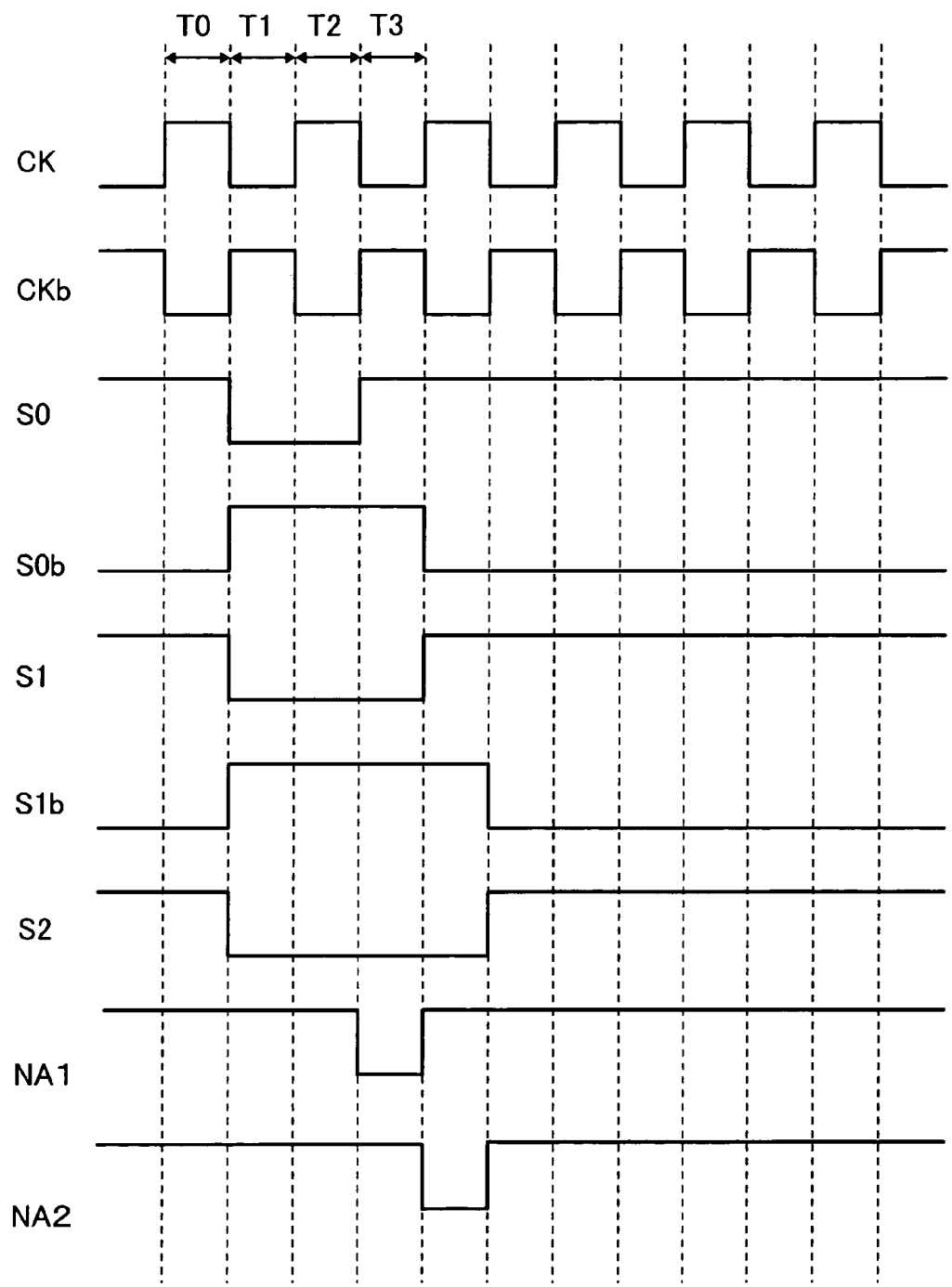
FIG. 3 is a timing chart of Embodiment Mode 1.

Next, a timing chart of the semiconductor circuit shown in FIG. 2A of this embodiment mode is shown in FIG. 3. The clock signal, the inverted clock signal, potential of each of the nodes S0, S0b, S1, S1b, and S2, shown in FIG. 2B, are shown here. As shown in FIG. 3, sections divided by a half cycle of a clock signal before and after a period of inputting a pulse of an input signal SP, are respectively denoted by T0, T1, T2, and T3.

Turning on and tuning off of each transistor in the first register 101 during the periods T0, T1, T2, and T3 in the timing chart shown in FIG. 3 will be described in more detail in FIGS. 4A and 4B and FIGS. 5A and 5B.

To provide a simple explanation, power supply voltage of a semiconductor circuit (an internal circuit) serving as a shift register is set to be 10 V (high potential power source Vdd is set to be 10 V and low potential power source Vss is set to be 0 V), an H level of amplitude voltage of a pulse signal such as a click signal CK, an inverted clock signal CKb, or an input signal input from an external circuit such as a controller IC is set to be 3 V and an L level of the amplitude voltage is set to be 0 V. An IC constituting part of an external circuit is operated at lower power supply potential than the internal circuit.

First, in FIG. 4A, during the period T0, since a clock signal CK is in the H level and the node S0 is also in the H level, the p-channel transistor 201 becomes a non-conduction state (hereinafter, referred to as being turned off). The first n-channel transistor 202 and the second n-channel transistor 203 become a conduction state (hereinafter, referred to as being turned on), and therefore, the node S0b becomes the L level. In this case, in the inverter circuit, the p-channel transistor 204 is turned on whereas the n-channel transistor 205 is turned off so that the node S1 outputs the H level.

Next, in FIG. 4B, during the period T1, a clock signal CK becomes the L level and the node S0 becomes the L level. In this case, the p-channel transistor 201 is turned on. Since the first n-channel transistor 202 and the second n-channel transistor 203 are turned off, the node S0b becomes the H level. In this case, in the inverter circuit, the p-channel transistor 204 is turned off whereas the n-channel transistor 205 is turned on so that the node S1 outputs the H level.

Next, in FIG. 5A, during the period T2, a clock signal CK becomes the H level and the node S0 becomes the L level. In this case, the p-channel transistor 201 is turned on. Since the first n-channel transistor 202 is turned off whereas the second n-channel transistor 203 is turned on, the node S0b becomes the H level. In this case, in the inverter circuit, since the p-channel transistor 204 is turned off whereas the n-channel transistor 205 is turned on, the node S1 output the H level.

Next, in FIG. 5B, during the period T3, a clock signal CK becomes the L level and the node S0 becomes the H level, and the p-channel transistor 201 is turned off. Since the first n-channel transistor 202 is turned on whereas the second n-channel transistor is turned off, the node S0b is in an electrically floating state. In this case, potential at the H level, which is potential of the node S0b in the period T2 previous to the period T3, is holded in the node S0b. In this case, in the inverter circuit, the p-channel transistor 204 is turned off and the n-channel transistor 205 is turned on, so that the node S1 outputs the H level.

Note that, in the second register 102, operation is determined by an inverted clock signal CKb and potential of the node S1 in the above described first register 101. With respect to operation of each transistor in the second register 102, a clock signal and an inverted clock signal are inverted, that is, the H level and the L level are inverted. Therefore, operation of each transistor of the second register 102 is the same as the operation of each transistor of the first register 101 in any of periods T0 to T3, and will not be described in more detail here.

Further, each transistor may have whatever polarity so long as it has a circuit structure performing the same operation as the present invention. For example, in order to invert a polarity of each transistor, a signal to be input to each transistor may be inverted. Therefore, the present invention is not particularly limited to a polarity of each transistor, a clock signal, and the like.

Further, the semiconductor circuit serving as a shift register of the present invention sequentially outputs signals each of which delays by a half cycle of each of clock signals (or inverted clock signals) by the NAND circuit for obtaining inverted AND of the node S0 and the node S1. Each of the signals sequentially output from the semiconductor circuit extracts a signal by which the node S0b is made to be in a low potential state from a high potential state in accordance with rising of the CK signals (in this specification, operation of changing a signal into an H level from an L level is referred to as rising). Therefore, a signal, which is not adversely affected by a delayed or dull waveform of a signal required for discharge and charge to a gate of a transistor can be output to a pixel portion.

Note that, when a signal, by which the node S0b is made to be in a high potential state from a low potential state, is extracted by falling (in this specification, operation of changing a signal to an H level from an L level is referred to as falling) of a clock signal (or an inverted clock signal), the first terminal of the second n-channel transistor whose gate is input with a clock signal (or, an inverted clock signal) may be connected to a high potential power source side and the second terminal of the second n-channel transistor may be connected to the first terminal of the p-channel transistor. Further, in this case, an H level of a clock signal to be input may be set to be equal to potential of the high potential power source and an L level may be set to be higher than potential of the low potential power source.

As described above, by using the semiconductor circuit serving as a shift register of the present invention, a signal which is delayed by a half cycle of a CK signal with respect to an input signal SP can be generated. Moreover, by connecting a plurality of semiconductor circuits serving as shift registers of the present invention to one another, a shift register circuit can be formed. In particular, in the first circuit group of this embodiment mode, control for making an signal output from the first circuit group to be in a low potential state from a high potential state with respect to a signal input to the first circuit group, is performed in synchronization with a clock signal or an inverted clock signal, and a pulse of the input signal is inverted so that a pulse, which is prolonged by half-wavelength of the clock signal, can be extracted.

In the semiconductor circuit serving as a shift register of the present invention, amplitude of a clock signal CK may be larger than a threshold value of the second n-channel transistor 203. This makes it possible to reduce power consumption.

The shift register described above is favorably operated without providing a level shift portion. Accordingly, an occupation area of a driver circuit over a substrate can be reduced so that a surface of the substrate can be efficiently utilized. Further, even when amplitude of a clock signal is made smaller than potential of power supply voltage, the above described semiconductor circuit serving as the shift register is difficult to be adversely affected by variations in threshold value and the like so that the semiconductor circuit can be favorably operated.

Note that this embodiment mode can be implemented by being freely combined with any description of embodiment modes throughout this specification.

Embodiment Mode 2

Figure 6:
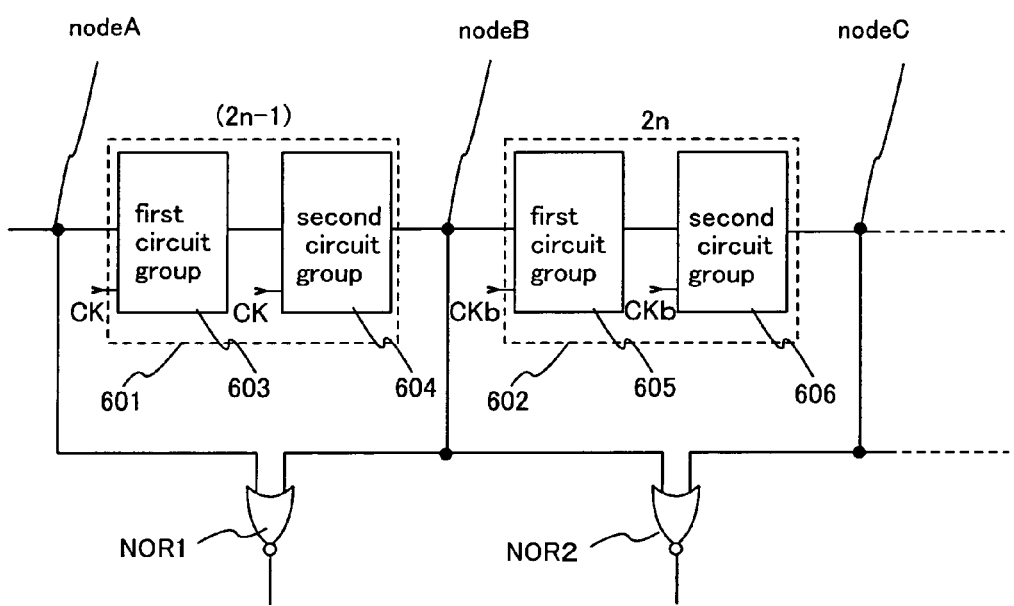
FIG. 6 is a block diagram showing a structure of Embodiment Mode 2.

FIG. 6 shows one embodiment mode of a semiconductor circuit, which serves as a shift register of the present invention. In FIG. 6, a register (a first register) 601 in the (2n−1)th (n is an arbitrary integer and m≧2n≧2, wherein m is the total number of stages provided in the shift register) stage, and a register (a second register) 602 in the 2n-th stage are shown. The register 601 includes a first circuit group 603 and a second circuit group 604. The register 602 includes a first circuit group 605 and a second circuit group 606. In the register 601 in the (2n−1)th stage, clock signals are input to the first circuit group 603 and the second circuit group 604. Further, in the register 602 in the 2n-th stage, inverted clock signals CKb are input to the first circuit group 605 and the second circuit group 606. Further, in a node A inputting a signal to the register 601 in the the (2n−1)th stage, a node B to which a signal is input from the register 601 in the (2n−1)th stage or which inputs a signal to the register 602 in the 2n-th stage, and a node C to which a signal is input from the register 602 in the 2n-th stage, an NOR circuit 1 (NOR1), which is connected to the node A and the node B, is provided to obtain an inverted sum of the node A and the node B and an NOR circuit 2 (NOR2), which is connected to the node B and the node C, is provided to obtain an inverted sum of the node B and the node C. Of course, other logic element may be arbitrarily disposed to be connected to other node in accordance with a signal to be output.

Figures 7A, 7B:
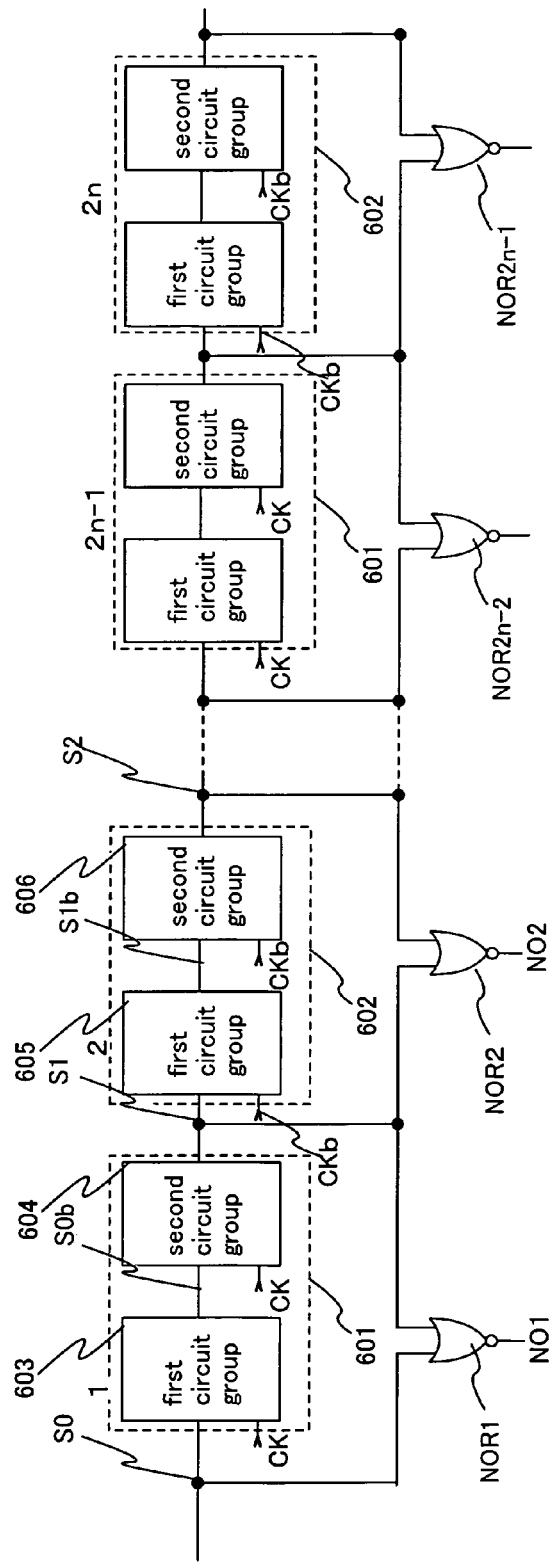
FIGS. 7A and 7B are circuit diagrams showing a structure of Embodiment Mode 2.

Further, a specific circuit structure of a semiconductor circuit, which serves as a shift register of the present invention of this embodiment mode, is shown in FIG. 7A. In FIG. 7A, as the first circuit group 603 constituting part of the first register 601, a first p-channel transistor 701, a first n-channel transistor 702, and a second n-channel transistor 703 are provided. As the second circuit group 604 constituting part of the first register 601, a second p-channel transistor 704, a third n-channel transistor 705, and a fourth n-channel transistor 706 are provided. In the second register, a plurality of transistors having the same structure are provided.

In FIG. 7A, a first terminal of the first p-channel transistor 701 is connected to a high potential power source Vdd, a second terminal of the first p-channel transistor 701 is connected to a first terminal of the first n-channel transistor 702, a second terminal of the first n-channel transistor 702 is connected to a first terminal of the second n-channel transistor 703, and a second terminal of the second n-channel transistor 703 is connected to a low potential power source (Vss or GND). Further, a first terminal of the second p-channel transistor 704 is connected to a high potential power source Vdd, a second terminal of the second p-channel transistor 704 is connected to a first terminal of the third n-channel transistor 705, a second terminal of the third n-channel transistor 705 is connected to a first terminal of the fourth n-channel transistor 706, and a second terminal of the fourth n-channel transistor 706 is connected to a low potential power source (Vss or GND). Further, the second terminal of the first p-channel transistor 701 and the first terminal of the first n-channel transistor 702 are connected to a gate of the second p-channel transistor 704 and a gate of the third n-channel transistor 705. Further, input signals SP are input to a gate of the first p-channel transistor 701 and a gate of the first n-channel transistor 702. Output signals are output from the second terminal of the second p-channel transistor 704 and the first terminal of the third n-channel transistor 705.

Further, FIG. 7A shows a structure in which a hold capacitor 711 is provided between the first circuit group and the second circuit group; however, the hold capacitor is not necessary to be provided. In a case where the hold capacitor is not provided, parasitic capacitance of each transistor may be used. Further, a circuit which can hold potential may be connected instead of the capacitor.

Further, in the present invention, two electrodes serving as a source and a drain, which are included in a single transistor, is determined whether any one of the two electrodes serves as the source or drain depending on a potential difference generated between these electrodes. Accordingly, it is difficult to define whichever electrode serves as a source or a drain. Therefore, in this specification, the two electrodes serving as a source and a drain are denoted by a first terminal and a second terminal.

In FIG. 7A, clock signals CK are input to a gate of the second n-channel transistor 703 of the first register 601 provided in the (2n−1)th (n is an arbitrary integer and m≧2n≧2) stage and a gate of the fourth n-channel transistor 706 of the first register 601. Further, inverted clock signals CKb are input to the gate of the second n-channel transistor 703 of the second register 602 provided in the 2n-th (n is an arbitrary integer and m≧2n≧2) stage and the gate of the fourth n-channel transistor 706 of the first register 601.

Next, each node shown in FIG. 7B will be described to explain a timing chart of the semiconductor circuit serving as a shift register of this embodiment mode. In FIG. 7B, in the first register 601, a node corresponding to the gate of the first p-channel transistor 701 and the gate of the first n-channel transistor 702 is denoted by S0. In the first register 601, a node corresponding to the second terminal of the first p-channel transistor 701 and the first terminal of the first n-channel transistor 702; or the gate of the second p-channel transistor 704 and the gate of the third n-channel transistor 705, is denoted by S0b. Further, a node corresponding to the second terminal of the second p-channel transistor 704 and the first terminal of the third n-channel transistor 705 of the first register 601; or the gate of the first p-channel transistor 701 and the gate of the first n-channel transistor 702 of the second register 602, is denoted by S1. In the second register 602, a node corresponding to the second terminal of the first p-channel transistor 701 and the first terminal of the first n-channel transistor 702; or the gate of the second p-channel transistor 704 and the gate of the third n-channel transistor 705, is denoted by S1b. A node corresponding to the second terminal of the second p-channel transistor 704 of the second register 602 is denoted by S2. Further, a node of an output terminal of the NOR1 is denoted by NO1 whereas a node of an output terminal of the NOR2 is denoted by NO2.

Figure 8:
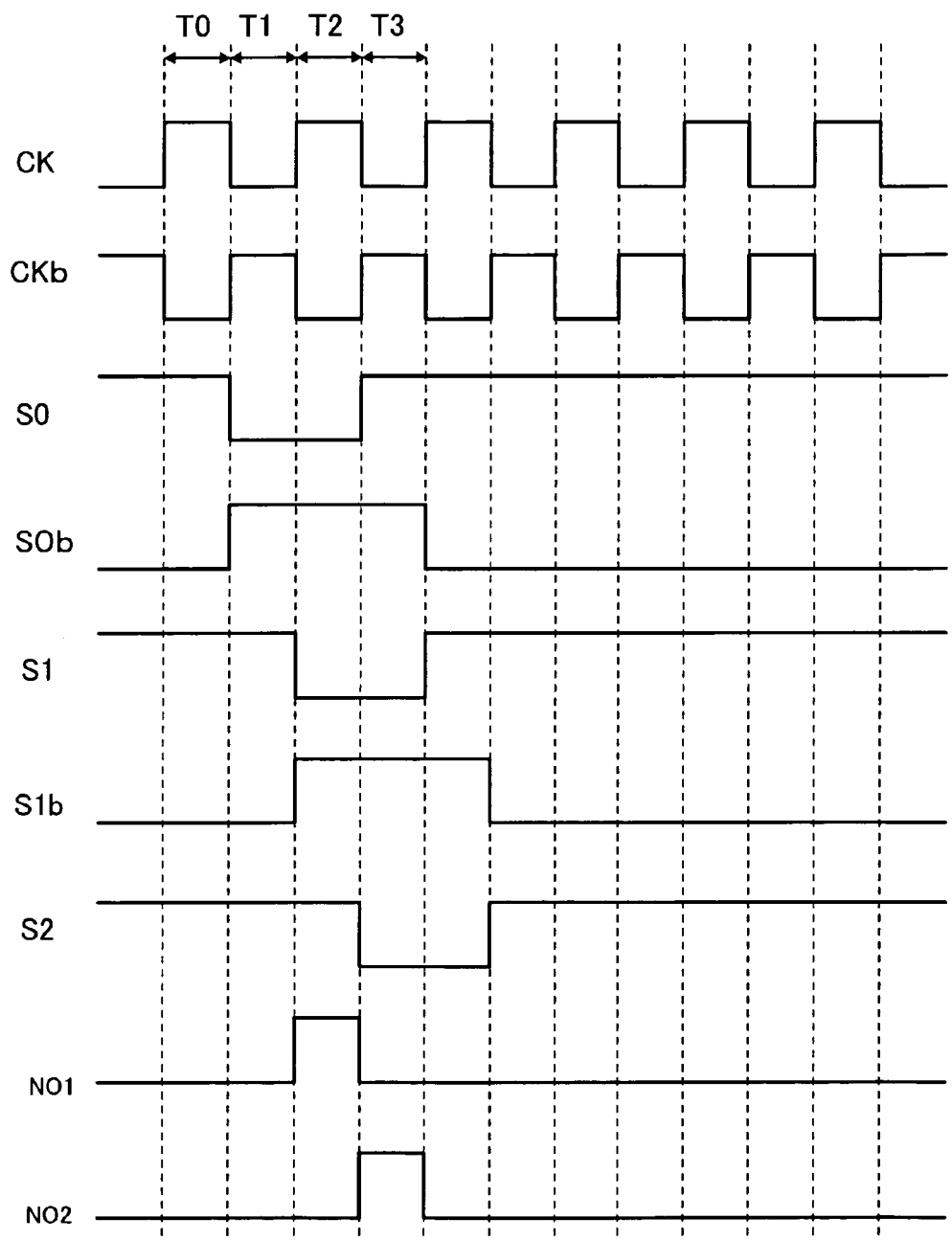
FIG. 8 is a timing chart of Embodiment Mode 2.

Next, a timing chart of the semiconductor circuit shown in FIG. 7A of this embodiment mode is shown in FIG. 8. The clock signal, the inverted clock signal, potential of each of the nodes S0, S0b, S1, S1b, and S2, shown in FIG. 7B, are shown here. Sections divided by a half cycle of a clock signal before and after a period of inputting a pulse of an input signal SP are respectively denoted by T0, T1, T2, and T3.

Turning on and tuning off of each transistor in the first register 601 during the periods T0, T1, T2, and T3 in the timing chart will described in more detail.

To provide a simple explanation, power supply voltage of a semiconductor circuit (an internal circuit) serving as a shift register is set to be 10 V (high potential power source Vdd is set to be 10 V and low potential power source Vss is set to be 0 V), amplitude voltage of a pulse signal such as a clock signal CK, an inverted clock signal CKb, or an input signal input from an external circuit such as a controller IC is set to be 3V (a high potential level (referred to as an H level, H potential, or H)), and a low potential level (referred to as an L level, L potential, or L) is set to be 0 V. The IC constituting part of the external circuit is operated at lower power supply potential than the internal circuit First, in FIG. 9A, during the period T0, since a clock signal CK is in the H level and the node S0 is also in the H level in the first circuit group 603, the first p-channel transistor 701 becomes a non-conduction state (turned off). The first n-channel transistor 702 and the second n-channel transistor 703 are turned on, and therefore, the node S0b becomes the L level. In this case, in the second circuit group 604, the second p-channel transistor 704 is turned off whereas the third n-channel transistor 705 is turned off. Since the fourth n-channel transistor 706 is turned on, the node S1 outputs the H level.

Next, in FIG. 9B, during the period T1, a clock signal CK becomes the L level and the node S0 becomes the L level in the first circuit group 603. In this case, the first p-channel transistor 701 is turned on. Since the first n-channel transistor 702 and the second n-channel transistor 703 are turned off, the node S0b becomes the H level. In this case, in the second circuit group 604, the second p-channel transistor 704 is turned off, the third n-channel transistor 705 is turned on, and the fourth n-channel transistor 706 is turned off. In this case, since the node S1 becomes an electrically floating state potential of the H level, which is potential of the node S1 of the period T0 previous to the period T1, is holded in the node S1, the node S1 outputs the H level.

Next, in FIG. 10A, during the period T2, a clock signal CK becomes the H level and the node S0 becomes the L level in the first circuit group 603. In this case, the first p-channel transistor 701 is turned on. Since the first n-channel transistor 702 is turned off whereas the second n-channel transistor 703 is turned on, the node S0b becomes the H level. In this case, in the second circuit group 604, the second p-channel transistor 704 is turned off whereas the third n-channel transistor 705 is turned on. Since the fourth n-channel transistor 706 is turned on, the node S1 output the L level.

Next, in FIG. 10B, during the period T3, a clock signal CK becomes the L level and the node S0 becomes the H level in the first circuit group 603, and the first p-channel transistor 701 is turned off. Since the first n-channel transistor 702 is turned on whereas the second n-channel transistor is turned off, the node S0b becomes an electrically floating state. In this case, potential of the H level, which is potential of the node S0b in of the period T2 previous to the period T3, is holded in the node S0b. At this moment, in the second circuit group 604, the second p-channel transistor 704 is turned off, the third n-channel transistor 705 is turned on, and the fourth n-channel transistor 706 is turned off. In this case, the node S1 becomes an electrically floating state. Since potential of the H level, which is potential of the node S1 in the period T0 previous to the period T1, is holded in the node S1, the node S1 outputs the H level.

Note that, in the second register 602, operation is determined by an inverted clock signal CKb and potential of the node S1 in the above described first register 601. In each transistor in the second register 602, a clock signal and an inverted clock signal are inverted, that is, an H level and an L level are inverted. Therefore, operation of each transistor in the second register 602 is the same as the operation of each transistor of the first register 601 in any of periods T0 to T3, and will not be described in more detail here.

Further, each transistor may have whatever polarity so long as it has a circuit structure performing the same operation as the present invention. For example, in order to invert a polarity of each transistor, a signal to be input to each transistor may be inverted. Therefore, the present invention is not particularly limited to a polarity of each transistor, a clock signal, and the like.

Further, the semiconductor circuit serving as a shift register of the present invention sequentially outputs signals each of which delays by a half cycle of each of CK signals by the NOR circuit for obtaining inverted AND of the node S0 and the node S1. Each of the signals sequentially output from the semiconductor circuit extracts a signal by rising of the CK signals (in this specification, operation of changing a signal into an H level from an L level is referred to as rising). Therefore, a signal, which is not adversely affected by a delayed or dull waveform of a signal required for discharge and charge to a gate of a transistor, can be output to a pixel portion.

As described above, by using the semiconductor circuit serving as a shift register of the present invention, a signal, which is delayed by a half cycle of a CK signal with respect to an input signal SP, can be generated. Moreover, by connecting a plurality of semiconductor circuits serving as shift registers of the present invention to one another, a shift register circuit can be formed.

In the semiconductor circuit serving as a shift register of the present invention, amplitude of a clock signal CK may be larger than a threshold value of the second n-channel transistor 703. This makes it possible to reduce power consumption as compared with a conventional semiconductor circuit serving as a shift register.

The shift register described above is favorably operated without providing a level shift portion. Accordingly, an occupation area of a driver circuit over a substrate can be reduced so that a surface of the substrate can be efficiently utilized. Further, even when amplitude of a clock signal is made smaller than potential of power supply voltage, the above described semiconductor circuit serving as the shift register is difficult to be adversely affected by variations in threshold value and the like so that the semiconductor circuit can be favorably operated.

Note that this embodiment mode can be implemented by being freely combined with any description of embodiment modes throughout this specification.

Embodiment 1

Figure 11A:
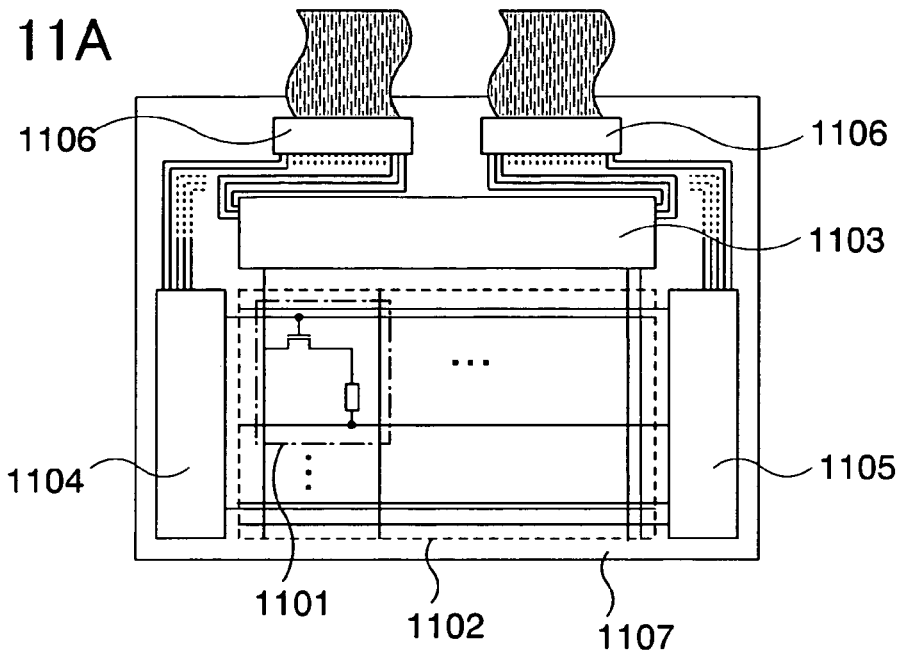
FIGS. 11A to 11C are block diagrams showing a structure of Embodiment 1.

In FIG. 11A, a pixel portion 1102 including a plurality of pixels 1101 arranged in an matrix form is provided over a substrate 1107. In the periphery of the pixel portion 1102, a signal line driver circuit 1103, a first scanning line driver circuit 1104, and a second scanning line driver circuit 1105 are provided. Signals are supplied to these driver circuits through FPCs 1106.

Figure 11B:
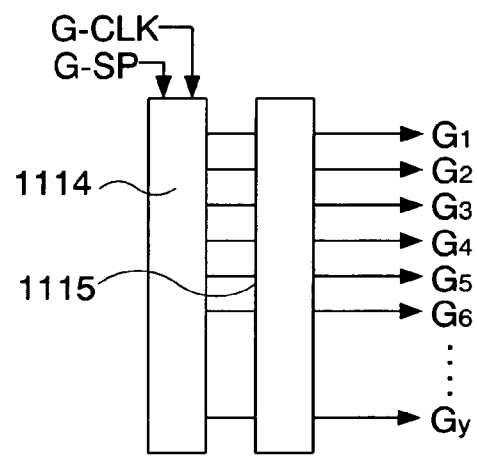
Figure 11C:
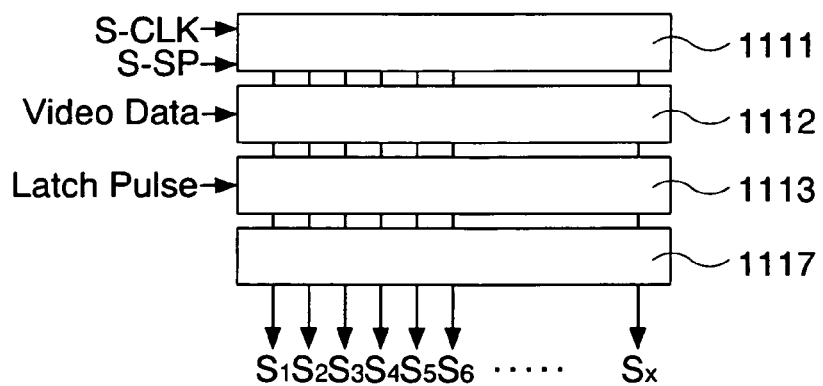

FIG. 11B shows a structure of each of the first scanning line driver circuit 1104 and the second scanning line driver circuit 1105. Each of the first scanning line driver circuit 1104 and the second scanning line driver circuit 1105 has a shift register 1114 and a buffer 1115. Further, FIG. 11C shows a structure of the signal line driver circuit 1103. The signal line driver circuit 1103 has a shift register 1111, a first latch circuit 1112, a second latch circuit 1113, and a buffer 1117.

Semiconductor circuits serving as shift registers of the present invention can be applied to the shift registers 1111 and 1114. By applying the semiconductor circuits serving as shift registers of the present invention, even when amplitude of a clock signal is lower than a potential difference between a high potential power source and a low potential power source, which drive the shift registers, the semiconductor circuits can be properly serve as the shift registers. Further, by applying the semiconductor circuits serving as the shift registers of the present invention, through current does not flow between the high potential power source and the low potential power source so that power consumption can be reduced. Furthermore, by applying the semiconductor circuits serving as the shift registers of the present invention, the number of transistors required for forming the semiconductor circuits can be reduced as compared with a conventional shift register circuit, so that high yield can be obtained. Moreover, by applying the semiconductor circuits serving as the shift registers of the present invention, the semiconductor circuits can be operated without providing a level shift portion, and hence, occupation areas of the semiconductor circuits over the substrate can be reduced.

Note that the structures of the scanning line driver circuit and the signal line driver circuit are not limited to the above described ones, and for example, each of the driver circuits may have a sampling circuit, a level shifter, or the like. Further, in addition to the above mentioned driver circuits, a circuit such as a CPU and a controller may be formed integrally over the substrate 1107. In this case, the number of external circuits (ICs) to which the substrate is connected can be reduced, which results in further reduction in weight and thickness. This is, in particular, suitable for a portable terminal.

Furthermore, this embodiment can be implemented by being freely combined with any description of the embodiment modes.

Embodiment 2

An example in which an n-channel transistor and a p-channel transistor included in a semiconductor circuit of the present invention are formed over a substrate having an insulated surface by using thin film transistors (TFTs), will be described. Manufacturing steps are briefly shown in FIGS. 12A to 12C, FIGS. 13A to 13C, and FIGS. 14A and 14B. An active matrix display device having a structure described in FIGS. 12A to 12C, FIGS. 13A to 13C, and FIGS. 14A and 14B can realize a liquid crystal display device or a display device using an EL (electroluminescence) element.

First, as shown in FIG. 12A, a blocking layer 402 made of an insulating film such as a silicon oxide film, a silicon nitride film or a silicon oxynitride film is formed over a glass substrate 401 formed of barium borosilicate glass or alumino borosilicate glass typified by #7059 glass or #1737 glass of Corning, Inc. For example, a silicon oxynitride film made of $SiH_4$, $NH_3$ and $N_2O$ is formed with a thickness of 10 to 200 nm (preferably, 50 to 100 nm) by a plasma CVD method, and similarly, a hydrogenated silicon oxynitride film made of $SiH_4$ and $N_2O$ is stacked thereover with a thickness of 50 to 200 nm (preferably, 100 to 150 nm). Although the blocking layer 402 is shown as a two-layer structure in this embodiment, the blocking layer 402 may have a single layer or stacked layers of two or more layers using the aforementioned insulating films.

Semiconductor layers 403 to 406 separated into island shapes are formed by using a semiconductor film having a crystalline structure (hereinafter referred to as a crystalline semiconductor film) that is obtained by crystallizing a semiconductor film having an amorphous structure by a laser annealing method or thermal treatment using an annealing furnace. The heat treatment can be performed by a heating furnace, laser irradiation, or irradiation with light emitted from a lamp instead of laser beam (hereinafter, referred to as lamp annealing), or a combination thereof. The island-shape semiconductor layers 403 to 406 are formed with a thickness of 25 to 80 nm (preferably, 30 to 60 nm). Although the material for the crystalline semiconductor film is not limited, it is preferably formed by using silicon or a silicon-germanium (SiGe) alloy.

To manufacture a crystalline semiconductor film by a laser annealing method, a continuous wave laser beam (CW laser beam) or a pulsed wave laser beam (pulsed laser beam) can be used. As the laser beam, a beam emitted from one or plural kinds of a gas laser such as an Ar laser, a Kr laser, or an excimer laser; a laser using, as a medium, single crystalline YAG, $YVO_4$, forsterite ($Mg_2SiO_4$), $YAlO_3$, or $GdVO_4$ or polycrystalline (ceramic) YAG, $Y_2O_3$, $YVO_4$, $YAlO_3$, or $GdVO_4$ doped with one or more of Nd, Yb, Cr, Ti, Ho, Er, Tm, and Ta as a dopant; a glass laser; a ruby laser; an alexandrite laser; a Ti: sapphire laser; a copper vapor laser; and a gold vapor laser, can be used. A laser beam having a fundamental wave of such lasers or a second to a fourth harmonic of the fundamental wave is irradiated to obtain a crystal with a large grain size. Typically, for instance, the second harmonic (532 nm) or the third harmonic (355 nm) of an Nd:$YVO_4$ laser (fundamental wave of 1,064 nm) can be used. In this case, the power density of about 0.01 to 100 $MW/cm^2$ (preferably, 0.1 to 10 $MW/cm^2$) is required for a laser. The scanning rate is approximately set about 10 to 2000 cm/sec to irradiate the semiconductor film.

Note that, a laser using, as a medium, single crystalline YAG, $YVO_4$, forsterite ($Mg_2SiO_4$), $YAlO_3$, or $GdVO_4$ or polycrystalline (ceramic) YAG, $Y_2O_3$, $YVO_4$, $YAlO_3$, or $GdVO_4$ doped with one or more of Nd, Yb, Cr, Ti, Ho, Er, Tm, and Ta as a dopant; an Ar ion laser; or a Ti: sapphire laser can be continuously oscillated. Further, pulse oscillation thereof can be performed with an oscillation frequency of 10 MHz or more by carrying out Q switch operation or mode synchronization. When a laser beam is oscillated with an oscillation frequency of 10 MHz or more, a semiconductor film is irradiated with a next pulse during the semiconductor film is melted by the laser beam and then is solidified. Therefore, differing from a case of using a pulse laser with a low oscillation frequency, a solid-liquid interface can be continuously moved in the semiconductor film so that crystal grains, which continuously grow toward a scanning direction, can be obtained.

When ceramic (polycrystal) is used as a medium, the medium can be formed to have a free shape for short times at low cost. When using a single crystal, a columnar medium with several mm in diameter and several tens of mm in length is usually used. In the case of using the ceramic, a medium bigger than the case of using the single crystal can be formed.

A concentration of a dopant such as Nd or Yb in a medium, which directly contributes to light emission, cannot be changed largely in both cases of the single crystal and the polycrystal, and therefore, there is a limitation in improvement in output of a laser by increasing the concentration to some extent. However, in the case of the ceramic, the size of a medium can be significantly increased as compared with the case of the single crystal, and therefore, drastic improvement in output of a laser can be expected.

Further, in the case of the ceramic, a medium with a parallel six-hedron shape or a cuboid shape can be easily formed. In a case of using a medium having such a shape, when oscillated light is made travel inside of the medium, a long path of the oscillated light can be obtained. Therefore, amplitude is increased and a laser beam can be oscillated at high output. Furthermore, a cross sectional shape of a laser beam emitted from a medium having such a shape, is a quadrangular shape, and therefore, as compared with a laser beam with a circular shape, the laser beam with the quadrangular shape in cross section have an advantage to be shaped into a linear beam. By shaping a laser beam emitted in the above described manner using an optical system, a linear beam with 1 mm or less in length of a short side and several mm to several m in length of a long side can be easily obtained. In addition, when a medium is uniformly irradiated with excited light, a linear beam is emitted with an uniform energy distribution in a long side direction.

When a semiconductor film is irradiated with such a linear beam, an entire surface of the semiconductor film can be uniformly annealed. In a case where uniform annealing is required from one end to the other end of linear beam, an ingenuity in which slits are disposed on the both ends of the linear beam so as to shield an attenuated portion of energy from light, or the like is required.

Then, a gate insulating film 407 is formed to cover the island-shape semiconductor layers 403 to 406. The gate insulating film 407 is formed with a thickness of 40 to 150 nm by a plasma CVD method or a sputtering method by using an insulating film containing silicon. In this embodiment, a silicon oxynitride film is formed with a thickness of 120 nm. Needless to say, the gate insulating film 407 is not limited to such a silicon oxynitride film, and other insulating films containing silicon may be used in a single layer or stacked layers.

Then, a first conductive film 408a and a second conductive film 408b are formed to form gate electrodes over the gate insulating film 407. In this embodiment, the first conductive film 408a is formed of tantalum nitride or titanium with a thickness of 50 to 100 nm, while the second conductive film 408b is formed of tungsten with a thickness of 100 to 300 nm. These materials are stable even under the thermal treatment of 400 to 600° C. in a nitrogen atmosphere, and there is no such concern that the resistivity is considerably increased.

Then, as shown in FIG. 12B, a mask 409 is formed by using a resist, and first etching treatment for forming gate electrodes is performed. Although the etching method is not particularly limited, an ICP (inductively coupled plasma) etching method is preferably used. The etching is performed by mixing $CF_4$ and $Cl_2$ as an etching gas, and generating plasma by supplying RF (13.56 MHz) power of 500 W to a coiled electrode with a pressure of 0.5 to 2 Pa, or preferably, 1 Pa. RF (13.56 MHz) power of 100 W is also supplied to a substrate side (a sample stage), and substantially a negative self-biasing voltage is applied thereto. In the case of mixing $CF_4$ and $Cl_2$, etching can be performed at about the same speed in any case of using a tungsten film, a tantalum nitride film, and a titanium film.

By the aforementioned etching conditions, end portions can have tapered shapes due to the shape of the mask formed using the resist and an effect of a bias voltage applied to the substrate side. The tapered portions are controlled to have an angle of 25 to 45 degrees. In order to perform etching without leaving a residue on the gate insulating film, the etching time is preferably increased by about 10 to 20%. The selection ratio of the silicon oxynitride film relatively to tungsten is 2 to 4 (typically, 3); therefore, an exposed surface of the silicon oxynitride film is etched by about 20 to 50 nm by overetching treatment. In this manner, first-shape conductive layers 410 to 415 including the first conductive films and the second conductive films (first conductive films 410a to 415a and second conductive films 410b to 415b), are formed by the first etching treatment. Reference numeral 416 is a gate insulating film, in which a region where is not covered with the first-shape conductive layers is etched by about 20 to 50 nm, and thus becomes thin.

As shown in FIG. 12C, first doping treatment is performed to dope an n-type impurity (a donor). The doping is performed by either an ion doping method or an ion implantation method. As a condition of the ion doping method, a dosage is set to $1 \times 10^{13}$ to $5 \times 10^{14}/cm^2$. As an impurity element imparting an n-type conductivity, an element belonging to Group 15 of the periodic table, and typically, phosphorus (P) or arsenic (As) is used. In this case, the first-shape conductive layers are used as masks while controlling the acceleration voltage (for example, 20 to 60 keV). In this manner, first impurity regions 417 to 420 are formed. For example, the first impurity regions 417 to 420 are formed with an n-type impurity concentration in the range of $1 \times 10^{20}$ to $1 \times 10^{21}/cm^3$.

Figure 13A:
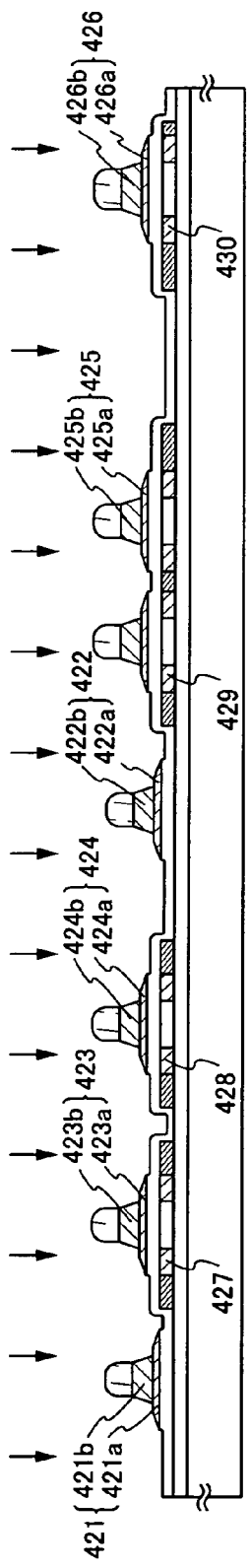
FIGS. 13A to 13C are cross sectional views of steps of manufacturing a transistor of Embodiment 2.

Second etching treatment shown in FIG. 13A is similarly performed by using an ICP etching apparatus, mixing $CF_4$, $Cl_2$ and $O_2$ as an etching gas, and generating plasma by supplying RF power (13.56 MHz) of 500 W to a coiled electrode with a pressure of 1 Pa. RF (13.56 MHz) power of 50 W is also supplied to a substrate side (sample stage), and a self-biasing voltage that is lower than that of the first etching treatment is applied thereto. In accordance with such conditions, the tungsten film is anisotropically etched so that the tantalum nitride film or the titanium film as a first conductive layer is kept remained. In this manner, second-shape conductive layers 421 to 426 (first conductive films 421a to 426a and second conductive films 421b to 426b) are formed. A region of the gate insulating film where is not covered with the second-shape conductive layers 421 to 426 are etched by about 20 to 50 nm, and thus becomes thin.

Then, second doping treatment is performed. The dosage is set lower than that in the first doping treatment, and an n-type impurity (a donor) is added with a condition of a high acceleration voltage. For example, doping is performed with an acceleration voltage of 70 to 120 keV, and a dosage of $1 \times 10^{13}/cm^2$, so that second impurity regions 427 to 430 are formed inside of the first impurity regions that are formed in the island-shape semiconductor layers in FIG. 12C. This doping is performed in such a manner that an impurity element is added into regions below the first conductive films 423a to 426a by using the second-shape conductive films 423b to 426b as masks. The impurity regions have a small difference in concentration distribution in the direction along the second-shape conductive layers since the first conductive films 423a to 426a remain with about the same thickness, and specifically, the impurity regions are formed to contain the n-type impurity (donor) with a concentration of $1 \times 10^{17}$ to $1 \times 10^{19}/cm^3$.

Figure 13B:
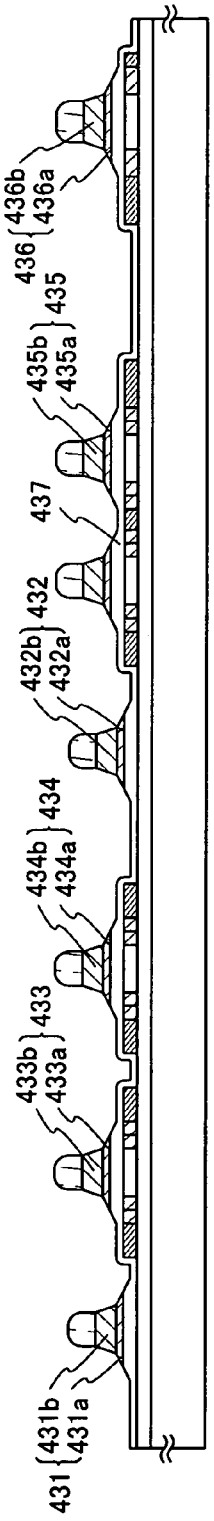

Then, as shown in FIG. 13B, third etching treatment is performed to etch the gate insulating film. As a result, the first conductive films 421a to 426a are also etched to have smaller end portions, thereby third-shape conductive layers 431 to 436 (first conductive films 431a to 436a and second conductive films 431b to 436b) are formed. Reference numeral 437 denotes a remaining gate insulating film. The etching may be performed to further degree so as to expose the surface of the semiconductor layers.

Figure 13C:
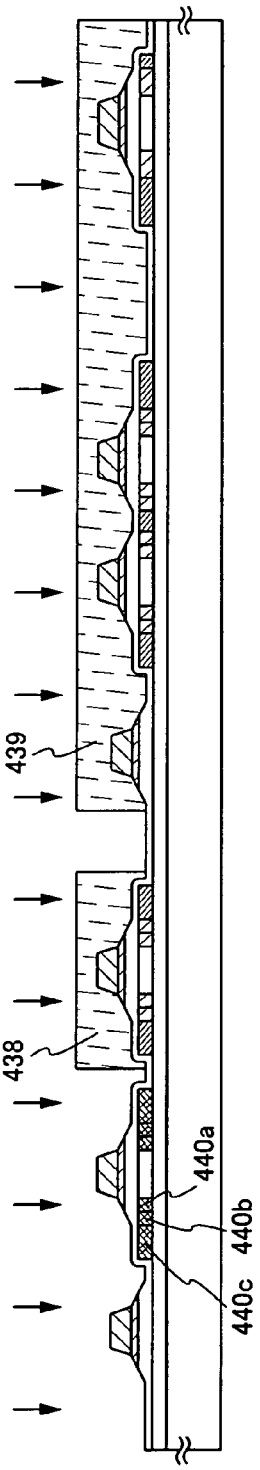

With respect to the p-channel TFTs, resist masks 438 and 439 are formed as shown in FIG. 13C, and the island-shape semiconductor layers for forming the p-channel TFTs are doped with a p-type impurity (an acceptor). The p-type impurity (acceptor) is selected from an element belonging to Group 13, and typically boron (B) is used. Third impurity regions 440a to 440c are controlled to have an impurity concentration of $2 \times 10^{20}$ to $2 \times 10^{21}/cm^3$. Although the third impurity regions are doped with phosphorus, it is further doped with boron at an equal or higher concentration to invert the conductivity type.

Through the aforementioned steps, the impurity regions are formed in the semiconductor layers. In FIG. 13C, the third-shape conductive layers 433 to 435 function as gate electrodes while the third-shape conductive layer 436 functions as a capacitive wiring. In addition, the third-shape conductive layers 431 and 432 form wirings such as source lines.

Then, in FIG. 14A, a first insulating film 441 made from a silicon nitride film (SiN:H) or a silicon oxynitride film ($SiN_xO_y$:H) is formed by a plasma CVD method. Then, a step for activating the impurity elements added into the respective island-shape semiconductor layers is performed so as to control the conductivity type. The activation is preferably performed by a thermal annealing method using an annealing furnace. Alternatively, a laser annealing method or a rapid thermal annealing method (RTA method) can be used. The thermal annealing method is performed at 400 to 700° C., or typically 500 to 600° C. with an oxygen concentration of 1 ppm or lower, or preferably in a nitrogen atmosphere of 0.1 ppm or lower. In this embodiment, thermal treatment is performed at 550° C. for 4 hours.

After that, a second insulating film 422 made of a silicon nitride film (SiN:H) or a silicon oxynitride film ($SiN_xO_y$:H) is formed over the first insulating film 441. Then, thermal treatment is performed at 350 to 500° C. With the hydrogen discharged from the second insulating film 442, the semiconductor films are hydrogenated.

Further, a third insulating film 443 made of an organic resin is formed with a thickness of about 1,000 nm as shown in FIG. 14B. As the organic resin film, polyimide, acrylic, polyimide amide or the like can be used. The organic resin film has advantages in that it is easy formed; parasitic capacitance can be reduced because of the low dielectric constant; high planarity is ensured; and the like. Note that organic resin films other than the aforementioned organic resin films can be used. Here, polyimide of a thermopolymerization type is applied over the substrate, and then baked at 300° C.

Next, contact holes are formed in the third insulating film 443, the second insulating film 442, and the first insulating film 441 so as to form a connection electrode 451 and source or drain wirings 444 to 447 by using aluminum (Al), titanium (Ti), tantalum (Ta), or the like. In a pixel portion, a first pixel electrode 450, a gate wiring 449, and a connection electrode 448 are formed.

In this manner, a p-channel TFT 453 and an n-channel TFT 454 are formed over the same substrate. Although FIG. 14B only shows a cross-sectional view of the p-channel TFT 453 and the n-channel TFT 454, these TFTs can be used to integrally form a gate signal line driver circuit and a source signal line driver circuit each having the semiconductor circuit of the present invention over the same substrate.

The structure of each of the thin film transistors described in this embodiment is only exemplary; therefore, the presenet invention is not limited to the manufacturing steps and structure shown in FIGS. 12A to 12C, FIGS. 13A to 13C, and FIGS. 14A and 14B. The semiconductor circuit of the invention can be integrally formed over the same substrate by a known manufacturing method of a thin film transistor. Since such a circuit can be formed over a large substrate such as a glass substrate at low cost by using thin film transistors, a larger area and lower cost of a display device can be achieved. In addition, by using the semiconductor circuits serving as shift registers of the present invention for a gate signal line driver circuit and a source signal line driver circuit, the semiconductor circuits can properly serve as the shift registers even when amplitude of a clock signal is smaller than a potential difference between a high potential power source and a low potential power source, which drive the shift registers. Further, by using the semiconductor circuits serving as the shift registers of the present invention, power consumption can be reduced while preventing pass-through current from flowing between the high potential power source and the low potential power source. Furthermore, by using the semiconductor circuits serving as the shift registers of the present invention, the number of transistors constituting the semiconductor circuits can be reduced as compared with a conventional shift register circuit, and therefore, high yield can be obtained. Moreover, by using the semiconductor circuits serving as the shift registers of the present invention, the semiconductor circuits can be operated without providing a level shift portion, so that an occupation area of the semiconductor circuits serving as the shift registers can be reduced.

The present embodiment can be implemented by being freely combined with any of the above described Embodiment Modes and Embodiments.

Embodiment 3

Figure 15:
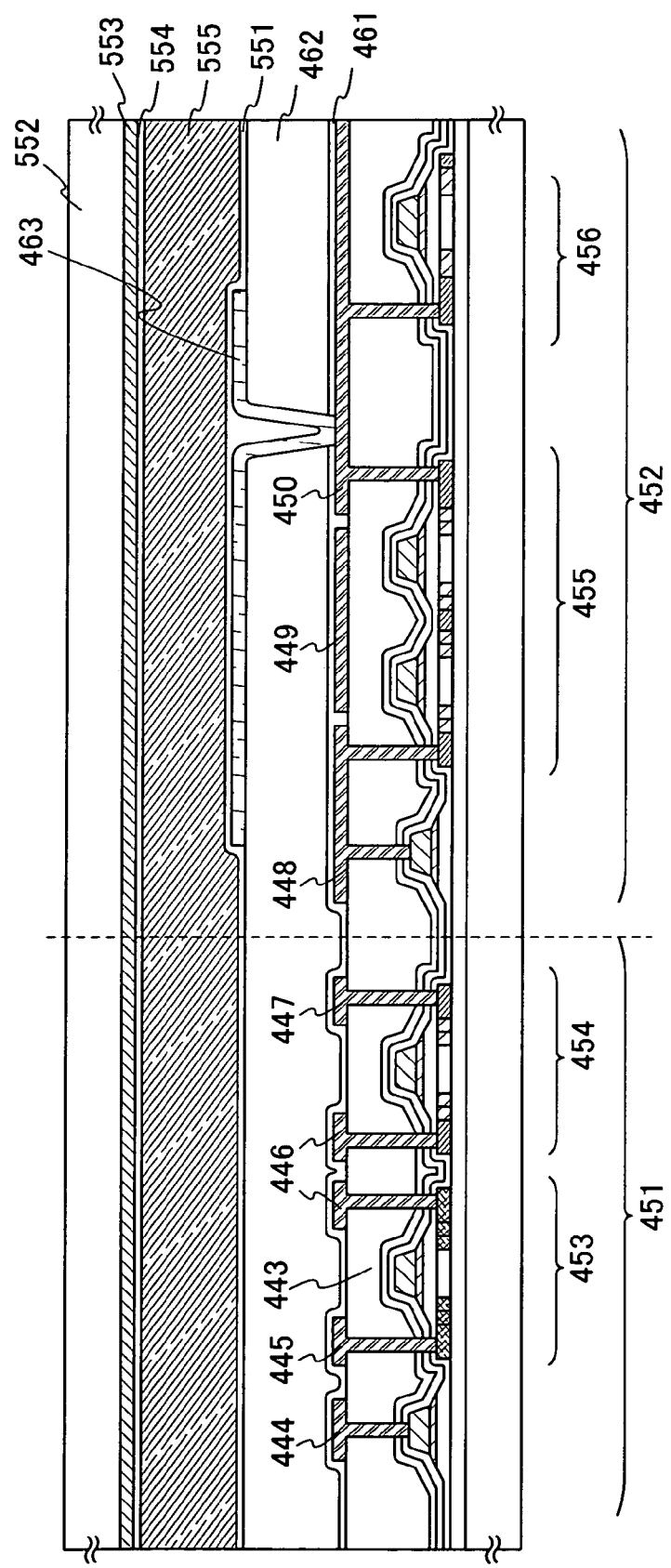
FIG. 15 is a cross sectional view of a liquid crystal module of Embodiment 3.

In this embodiment, steps of manufacturing an active matrix liquid crystal display device by using an active matrix substrate, will be described. As shown in FIG. 15, interlayer films 461 and 462 are formed over the substrate with the condition of FIG. 14B, and a second pixel electrode 463 is formed thereover. Then, an alignment film 551 is formed thereover. In this embodiment, a polyimide film is used as the alignment film. Over a counter substrate 552, a transparent conductive film 553 and an alignment film 554 are formed. Note that a color filter or a light shielding film may be formed over the counter substrate as required.

Then, after forming the alignment film, it is subjected to rubbing treatment so that liquid crystal molecules can be adjusted to be aligned with a predetermined pretilt angle. Then, the active matrix substrate over which the pixel portion and the driver circuit are formed is attached to the counter substrate by using a sealant, a spacer (neither of them is shown) and the like through a known cell assembling step.

After that, a liquid crystal 555 is injected between the both substrates and it is completely sealed with a sealant (not shown). Known liquid crystal materials may be used for the liquid crystal. In this manner, the active matrix display device shown in FIG. 15 is completed.

Next, a structure of the active matrix liquid crystal display device will be described with reference to a perspective view of FIG. 16. An active matrix substrate includes a pixel portion 1602, a gate side driver circuit 1603 and a source side driver circuit 1604 formed over a glass substrate 1601. A pixel TFT 1605 in the pixel portion is an n-channel TFT and connected to a pixel electrode 1606 and a storage capacitor 1607.

In addition, the driver circuits formed in the periphery are formed by using the semiconductor circuit of the present invention as a unit. The gate side driver circuit 1603 and the source side driver circuit 1604 are respectively connected to the pixel portion 1602 through a gate wiring 1608 and a source wiring 1609. An external input/output terminal 1611 to which an FPC 1610 is connected is provided with input/output wirings (connecting wirings) 1612 and 1613 for transmitting signals to the driver circuits. In addition, reference numeral 1614 is a counter substrate.

Figure 16:
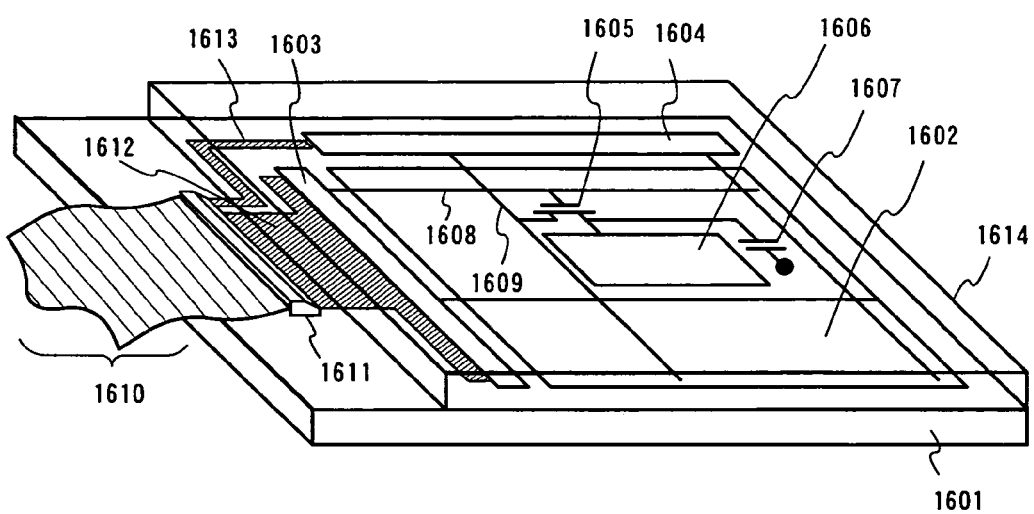
FIG. 16 is a perspective view of a liquid crystal module of Embodiment 3.

The structure of the active matrix liquid crystal display device described in this embodiment is only exemplary; therefore, the present invention is not limited to the structure shown in FIG. 15 and FIG. 16. The semiconductor circuit of the invention can be mounted over a driver circuit portion of the active matrix liquid crystal display device by a known manufacturing method of an active matrix liquid crystal display device. Since the active matrix liquid crystal display device having the semiconductor circuit of the invention can be formed over a large substrate such as a glass substrate at low cost by using thin film transistors, a larger area and lower cost of the display device can be achieved. In addition, by using the semiconductor circuits serving as shift registers of the present invention for a gate signal line driver circuit and a source signal line driver circuit, the semiconductor circuits can properly serve as the shift registers even when amplitude of a clock signal is smaller than a potential difference between a high potential power source and a low potential power source, which drive the shift registers. Further, by using the semiconductor circuits serving as the shift registers of the present invention, power consumption can be reduced while preventing pass-through current from flowing between the high potential power source and the low potential power source. Furthermore, by using the semiconductor circuits serving as the shift registers of the present invention, the number of transistors constituting the semiconductor circuits can be reduced as compared with a conventional shift register circuit, and therefore, high yield can be obtained. Moreover, by using the semiconductor circuits serving as the shift registers of the present invention, the semiconductor circuits can be operated without providing a level shift portion, so that an occupation area of the semiconductor circuits serving as the shift registers can be reduced.

Note that although the semiconductor device shown in FIG. 16 is called an active matrix liquid crystal display device in this specification, a liquid crystal panel to which an FPC is attached as shown in FIG. 16 is generally called a liquid crystal module. Accordingly, the active matrix liquid crystal display device in this embodiment may be called a liquid crystal module.

The present embodiment can be implemented by being freely combined with any of the above described Embodiment Modes and Embodiments.

Embodiment 4

Figure 17A:
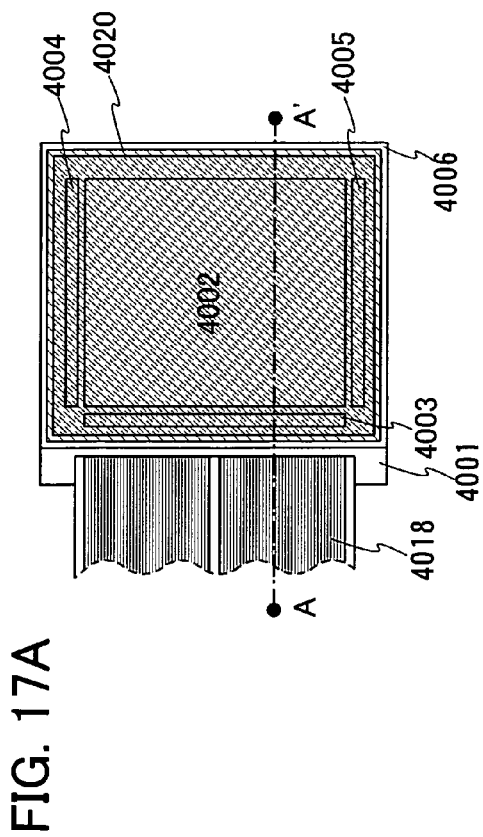
FIG. 17A is a perspective view and FIG. 17B is a cross sectional view of an EL module of Embodiment 4.
Figure 17B:
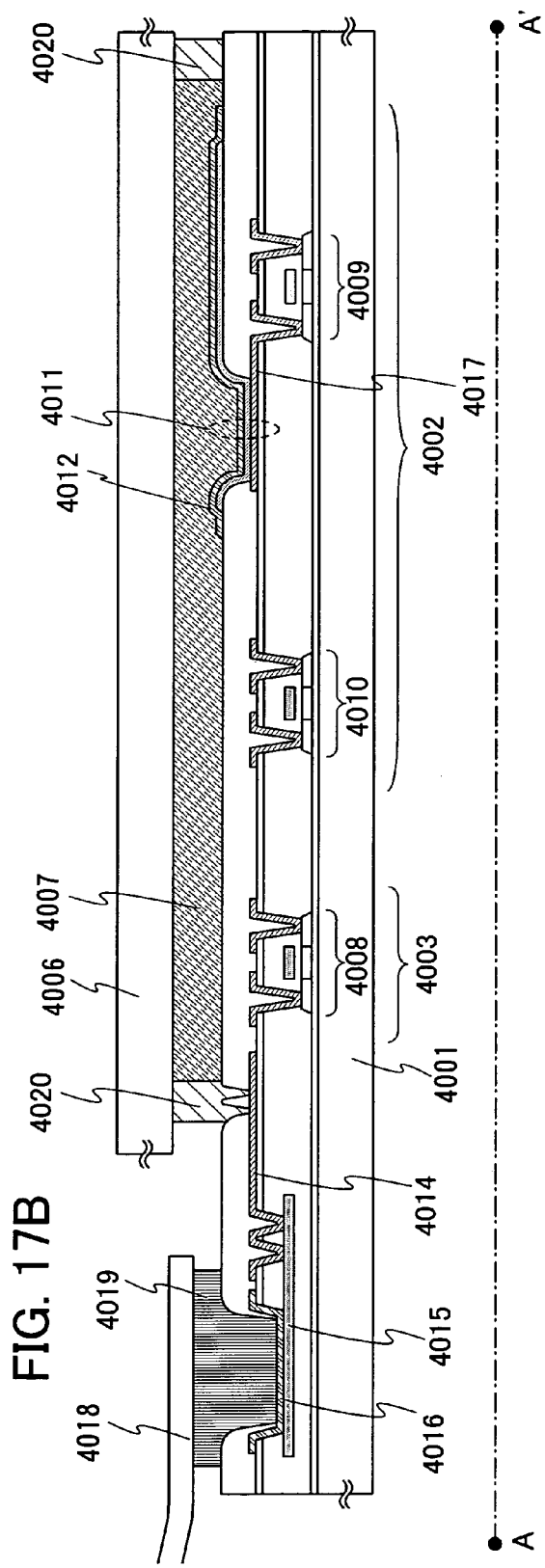

In this embodiment, an external view of a panel corresponding to one mode of a light emitting device having the semiconductor circuit of the present invention will be described with reference to FIGS. 17A and 17B. FIG. 17A is a top view of a panel where transistors and light emitting elements formed over a first substrate are sealed between the first substrate and a second substrate with a sealant, and FIG. 17B is a cross sectional view along a line A-A' of FIG. 17A.

A sealant 4020 is formed to surround a pixel portion 4002, a signal line driver circuit 4003, a first scanning line driver circuit 4004, and a second scanning line driver circuit 4005 that are provided over a first substrate 4001. In addition, a second substrate 4006 is provided over the pixel portion 4002, the signal line driver circuit 4003, the first scanning line driver circuit 4004 and the second scanning line driver circuit 4005. Accordingly, the pixel portion 4002, the signal line driver circuit 4003, the first scanning line driver circuit 4004 and the second scanning line driver circuit 4005 are tightly sealed together with a filling material 4007 by the first substrate 4001, the sealant 4020, and the second substrate 4006.

The pixel portion 4002, the signal line driver circuit 4003, the first scanning line driver circuit 4004, and the second scanning line driver circuit 4005 provided over the first substrate 4001 include multiple transistors. FIG. 17B illustrates a transistor 4008 included in the signal line driver circuit 4003, and a driving transistor 4009, and a switching transistor 4010 included in the pixel portion 4002.

Reference numeral 4011 corresponds to a light emitting element, and part of a wiring 4017 connected to a drain of the driving transistor 4009 functions as a first electrode of the light emitting element 4011. In addition, a transparent conductive film functions as a second electrode 4012 of the light emitting element 4011. The structure of the light emitting element 4011 is not limited to the one shown in this embodiment. The structure of the light emitting element 4011 may be appropriately changed in accordance with the direction of light extracted from the light emitting element 4011, polarity of the driving transistor 4009 and the like.

Various signals and voltages supplied to the signal line driver circuit 4003, the first scanning line driver circuit 4004, the second scanning line driver circuit 4005 or the pixel portion 4002 are supplied from a connecting terminal 4016 through lead wirings 4014 and 4015 though not shown in the cross-sectional view shown in FIG. 17B.

In this embodiment, the connecting terminal 4016 is formed of the same conductive film as the second electrode 4012 of the light emitting element 4011. In addition, the lead wiring 4014 is formed of the same conductive film as the wiring 4017. The lead wiring 4015 is formed of the same conductive film as the gates of the driving transistor 4009, the switching transistor 4010, and the transistor 4008.

The connecting terminal 4016 is electrically connected to a terminal of an FPC 4018 through an anisotropic conductive film 4019.

Note that the first substrate 4001 and the second substrate 4006 can be formed by using glass, metal (typically, stainless steel), ceramic, or plastic. As the plastic, an FRC (fiberglass-reinforced plastic) plate, a PVF (polyvinyl fluoride) film, a mylar film, a polyester film, or an acrylic resin film can be used. Alternatively, a sheet having such a structure that aluminum foil is sandwiched between PVF films or mylar films can be used.

Note that the second substrate 4006 positioned in the direction for extracting light from the light emitting element 4011 is required to transmit light. Therefore, the second substrate 4006 is formed by using a material having a light transmitting property such as a glass substrate, a plastic substrate, a polyester film, or an acrylic resin film.

As the filling material 4007, an inert gas such as nitrogen or argon can be used as well as an ultraviolet curable resin or a heat curable resin such as PVC (polyvinyl chloride), acrylic, polyimide, epoxy resin, silicone resin, PVB (polyvinyl butyral), or EVA (ethylene vinyl acetate). In this embodiment, nitrogen is used as the filling material.

The driver circuits provided on the periphery are formed by using as a unit the semiconductor circuit of the invention. Each of the first scanning line driver circuit 4004, the second scanning line driver circuit 4005, and the signal line driver circuit 4003 is connected to the pixel portion through a gate wiring and a source wiring.

This embodiment can be freely implemented in combination with any of the aforementioned embodiment modes and embodiments.

The structure of the light emitting device described in this embodiment is only exemplary; therefore, the present invention is not limited to the structure shown in FIGS. 17A and 17B. The semiconductor circuit of the present invention can be mounted over a driver circuit portion of the light emitting device by a known manufacturing method of a light emitting device. Since the light emitting device having the semiconductor circuit of the present invention can be formed over a large substrate such as a glass substrate at low cost by using thin film transistors, a larger area and lower cost of a display device can be achieved. In addition, by using the semiconductor circuits serving as shift registers of the present invention for a gate signal line driver circuit and a source signal line driver circuit, the semiconductor circuits can properly serve as the shift registers even when amplitude of a clock signal is smaller than a potential difference between a high potential power source and a low potential power source, which drive the shift registers. Further, by using the semiconductor circuits serving as the shift registers of the present invention, power consumption can be reduced while preventing through current from flowing between the high potential power source and the low potential power source. Furthermore, by using the semiconductor circuits serving as the shift registers of the present invention, the number of transistors constituting the semiconductor circuits can be reduced as compared with a conventional shift register circuit, and therefore, high yield can be obtained. Moreover, by using the semiconductor circuits serving as the shift registers of the present invention, the semiconductor circuits can be operated without providing a level shift portion, so that an occupation area of the semiconductor circuits serving as the shift registers can be reduced.

Note that although the semiconductor device shown in FIGS. 17A and 17B is called an active matrix light emitting device in this specification, a panel using an EL element to which an FPC is attached as shown in FIG. 17A is called an EL module in this specification.

The present embodiment can be implemented by being freely combined with any of the above described Embodiment Modes and Embodiments.

Embodiment 5

Figure 18:
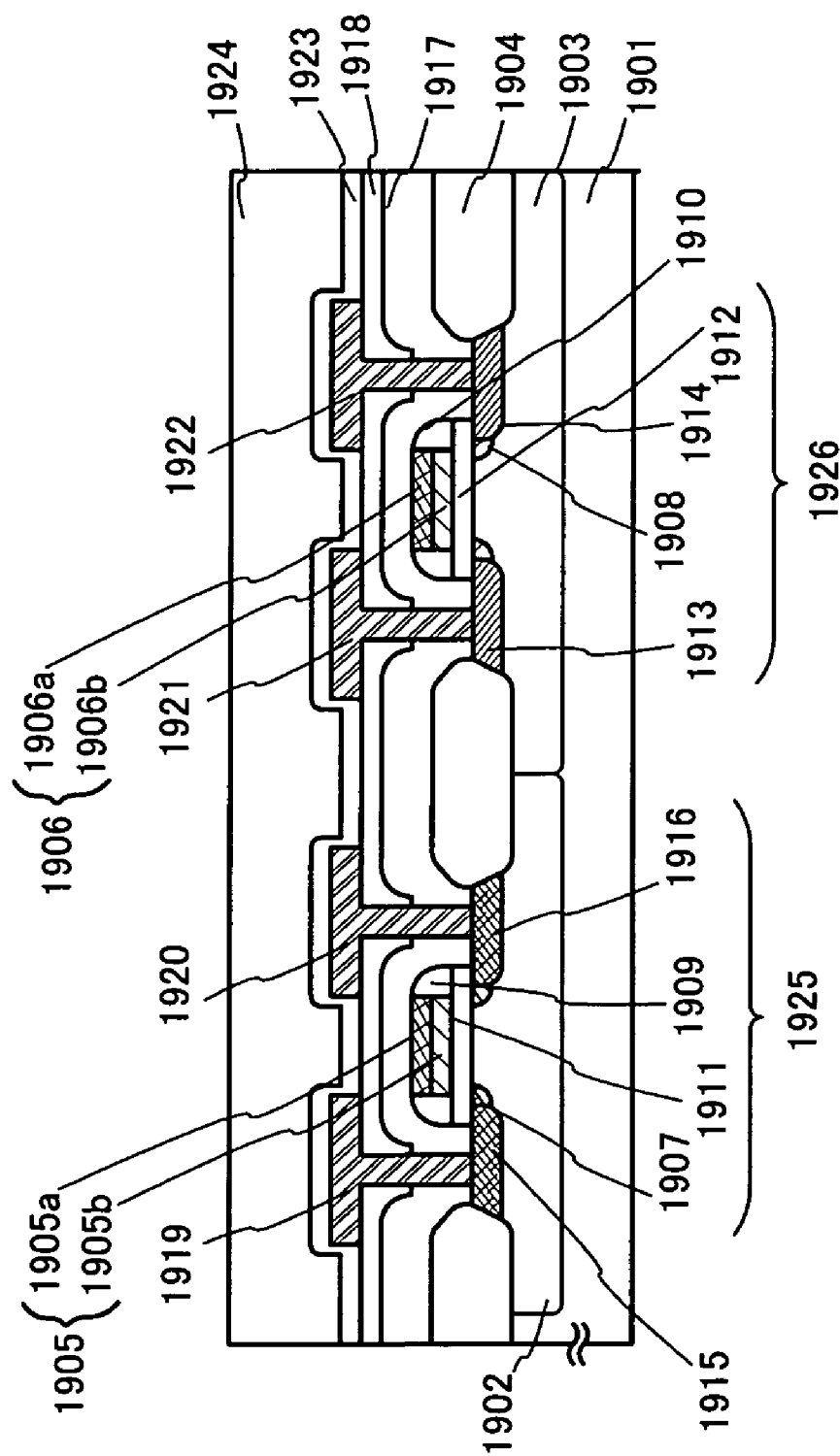
FIG. 18 is a cross sectional view of a transistor of Embodiment 5.

An example of manufacturing an n-channel transistor and a p-channel transistor for constructing a semiconductor circuit of the present invention over a single crystalline substrate, will be briefly described below with reference to FIG. 18.

First, a silicon substrate 1901 formed of single crystalline silicon is prepared. In a first element forming region over a main surface of the silicon substrate (over an element forming region or a circuit forming region) and a second element forming region thereof, an n-type well 1902 and a p-type well 1903 are selectively formed respectively.

Then, a field oxide film 1904 to serve as an element isolation region for separating the first element forming region from the second element forming region is formed. The field oxide film 1904 is a thick thermal oxide film, and may be formed by a known LOCOS method. Note that the element isolation method is not limited to the LOCOS method, and for example, the element isolation region may have a trench structure by using a trench isolation method or may have a combination of the LOCOS structure and the trench structure.

Then, a gate insulating film is formed by, for example, thermally oxidizing the surface of the silicon substrate. The gate insulating film may be formed by a CVD method and can be formed by using a silicon oxynitride film, a silicon oxide film, a silicon nitride film, or a stacked film thereof. For example, a stacked film is formed by stacking a silicon oxide film with a thickness of 5 nm obtained by thermal oxidation and a silicon oxynitride film with a thickness of 10 to 15 nm obtained by the CVD method.

Then, stacked films of polysilicon layers 1905b and 1906b and silicide layers 1905a and 1906a are formed over the entire surface to form stacked films based on a lithography technique and a dry etching technique, thereby forming gate electrodes 1905 and 1906 having a polycide structure over the gate insulating film. The polysilicon layers 1905b and 1906b may be doped with phosphorus (P) in advance at a concentration of about $10^{21}/cm^3$ in order to lower the resistivity, or n-type impurities may be diffused with high concentration after forming the polysilicon films. The silicide layers 1905a and 1906a may be formed by using molybdenum silicide ($MoSi_x$), tungsten silicide ($WSi_x$), tantalum silicide ($TaSi_x$), titanium silicide ($TiSi_x$) or the like and may be formed by a known method.

Then, ion implantation is performed to the silicon semiconductor substrate through the gate insulating film in order to form extension regions. In this embodiment, an impurity region formed between each of the source and drain regions and the channel forming region is called an extension region. There are cases where extension regions 1907 and 1908 may have an impurity concentration that is lower, equal to, or higher than those of the source regions and drain regions. That is, the impurity concentration of the extension regions may be determined based on the characteristics required for the semiconductor device.

In this embodiment, the first element forming region for forming a p-channel FET is covered with a resist material, and arsenic (As) or phosphorus (P) as an n-type impurity is injected into the silicon substrate. In addition, the second element forming region for forming an n-channel FET is covered with a resist material, and boron (B) as a p-type impurity is injected into the silicon substrate.

Then, first activation treatment is performed for activating the ion-implanted impurities and for recovering crystal defects in the silicon substrate that have been generated by the ion implantation. The activation is performed by heating the semiconductor substrate up to a temperature of around the melting point of Si.

Then, sidewalls 1909 and 1910 are formed on opposite side walls of the gate electrodes. For example, the sidewalls may be formed by stacking an insulating material layer made of silicon oxide over the entire surface by a CVD method, and then performing etch back to the insulating material layer. In performing the etch back, the gate insulating film may be selectively removed in a self-aligning manner. In addition, etching of the gate insulating film may be performed after the etch back. In this manner, gate insulating films 1911 and 1912 are formed, each of which has an equal width to a total width of the gate electrode and the sidewalls provided on the opposite side walls of the gate electrode.

Then, ion implantation is performed to the exposed silicon substrate in order to form source regions and drain regions. The first element forming region for forming a p-channel FET is covered with a resist material, and arsenic (As) or phosphorus (P) as an n-type impurity is injected into the silicon substrate, thereby forming a source region 1913 and a drain region 1914. In addition, the second element forming region for forming an n-channel FET is covered with a resist material, and boron (B) as a p-type impurity is injected into the silicon substrate, thereby forming a source region 1915 and a drain region 1916.

Then, second activation treatment is performed for activating the ion-implanted impurities and for recovering crystal defects in the silicon substrate that have been generated by the ion implantation.

After the activation, an interlayer insulating film, a plug electrode, a metal wiring and the like are formed. A first interlayer insulating film 1917 is formed with a thickness of 100 to 2,000 nm by a plasma CVD method or a low pressure CVD method by using a silicon oxide film, a silicon oxynitride film, or the like. Then, a second interlayer insulating film 1918 is formed thereover by using phosphorus silicate glass (PSG), boron silicate glass (BSG), or phosphorus boron silicate glass (PBSG). The second interlayer insulating film 1918 is manufactured by a spin coating method or a normal pressure CVD method in order to increase the planarity.

Source electrodes 1919 and 1921 and drain electrodes 1920 and 1922 are formed after forming contact holes in the first interlayer insulating film 1917 and the second interlayer insulating film 1918 to reach the source regions and the drain regions of the respective FETs, and preferably formed by using aluminum (Al) that is often used as a low-resistance material in general. Alternatively, a stacked structure of Al and titanium (Ti) may be used.

In addition, though not shown in the drawing, a contact hole is provided in the first interlayer insulating film 1917 and the second interlayer insulating film 1918 to reach the gate electrode, so that an electrode is formed to be electrically connected to a wiring provided over the first interlayer insulating film.

Finally, a passivation film 1923 and a third interlayer insulating film 1924 are formed. In FIG. 18, the left side corresponds to a p-channel transistor 1925 while the right side corresponds to an n-channel transistor 1926.

The passivation film 1923 is formed by a plasma CVD method by using a silicon nitride film, a silicon oxide film, or a silicon nitride oxide film. Further, the third interlayer insulating film 1924 is formed with a thickness of 1 to 2 μm by using an organic resin material. As the organic resin material, polyimide, polyamide, acrylic, benzocyclobutene (BCB), or the like can be used. What is advantageous in using an organic resin film is that the organic resin film is easily formed, parasitic capacitance can be lowered since a relative dielectric constant is low, and therefore it is suitable for planarization. Needless to say, an organic resin film other than the aforementioned organic resin films can be used.

In this manner, the p-channel transistor 1925 and the n-channel transistor 1926 are completed. The structure of the transistors described in this embodiment is only exemplary; therefore, the present invention is not limited to the manufacturing steps and structure shown in FIG. 18. The semiconductor circuit of the present invention can be formed over a single crystalline substrate by a known manufacturing method of transistors over a single crystalline substrate. Such a circuit can operate at high speed by being formed over a single crystalline substrate, and further a driving voltage can be lowered to reduce power consumption. In addition, by using the semiconductor circuits serving as shift registers of the present invention for a gate signal line driver circuit and a source signal line driver circuit, the semiconductor circuits can properly serve as the shift registers even when amplitude of a clock signal is smaller than a potential difference between a high potential power source and a low potential power source, which drive the shift registers. Further, by using the semiconductor circuits serving as the shift registers of the present invention, power consumption can be reduced while preventing through current from flowing between the high potential power source and the low potential power source. Furthermore, by using the semiconductor circuits serving as the shift registers of the present invention, the number of transistors constituting the semiconductor circuits can be reduced as compared with a conventional shift register circuit, and therefore, high yield can be obtained. Moreover, by using the semiconductor circuits serving as the shift registers of the present invention, the semiconductor circuits can be operated without providing a level shift portion, so that an occupation area of the semiconductor circuits serving as the shift registers can be reduced.

Embodiment 6

As an electronic appliance having a semiconductor device of the present invention, a television receiver, a camera such as a video camera and a digital camera, a goggle display, a navigation system, an audio reproducing device (e.g., a car audio component set), a computer, a game machine, a portable information terminal (e.g., a mobile computer, a portable phone, a portable game machine, an electronic book, or the like), an image reproducing device provided with a recording medium (specifically, a device for reproducing a recording medium such as a digital versatile disc (DVD) and having a display portion for displaying the reproduced image), and the like can be given. Specific examples of these electronic appliances are shown in FIG. 19, FIG. 20, FIGS. 21A and 21B, FIGS. 22A and 22B, FIG. 23, and FIGS. 24A to 24E.

Figure 19:
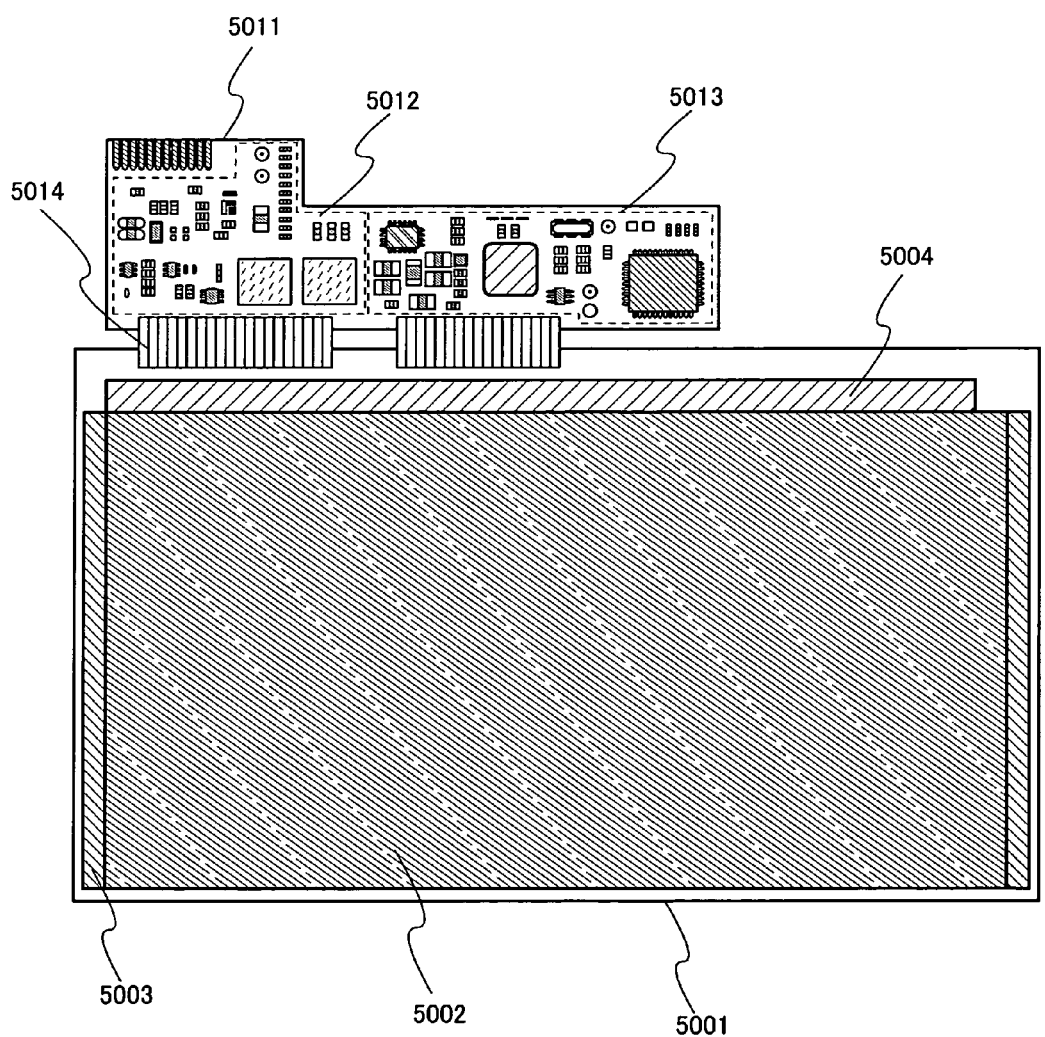
FIG. 19 is a diagram showing an example of an electronic appliance to which the present invention is applied.

FIG. 19 shows an EL module constructed by combining a display panel 5001 and a circuit substrate 5011. Over the circuit substrate 5011, a control circuit 5012, a signal dividing circuit 5013, and the like are formed, which are electrically connected to the display panel 5001 through a connecting wiring 5014.

The display panel 5001 has a pixel portion 5002 where multiple pixels are provided, a scanning line driver circuit 5003, and a signal line driver circuit 5004 for supplying a video signal to a selected pixel. Note that in the case of manufacturing the EL module, a semiconductor device included in each pixel of a pixel portion 5002 may be formed by using the above described Embodiments. In addition, a control driver circuit portion such as the scanning line driver circuit 5003 or the signal line driver circuit 5004 can be manufactured by using a TFT formed in accordance with the aforementioned embodiments. In this manner, an EL module television shown in FIG. 19 can be completed.

Figure 20:
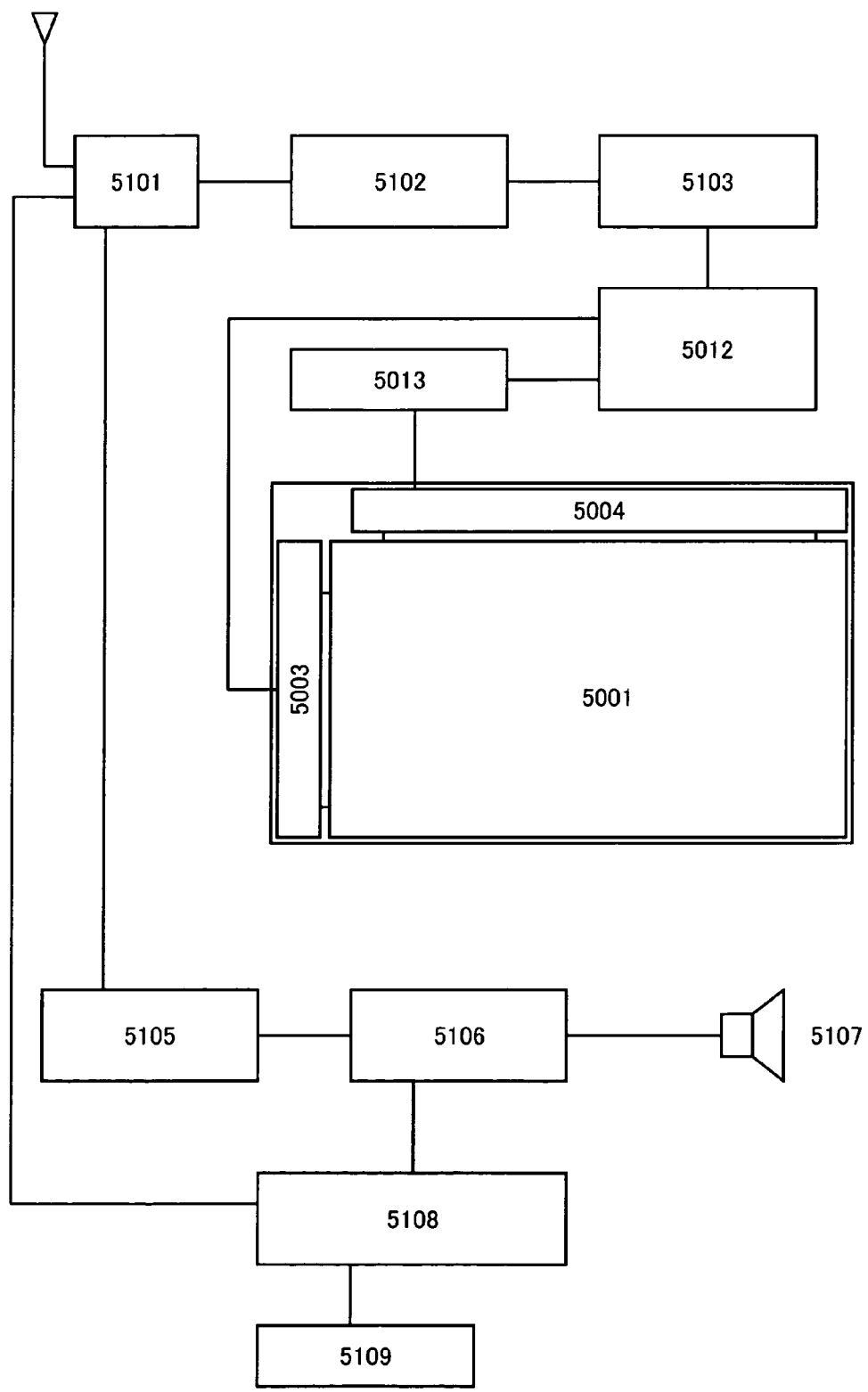
FIG. 20 is a view showing an example of an electronic appliance to which the present invention is applied.

FIG. 20 is a block diagram showing a main configuration of an EL television receiver. A tuner 5101 receives video signals and audio signals. The video signals are processed by a video signal amplifying circuit 5102, a video signal processing circuit 5103 for converting the signals output from the video signal amplifying circuit 5102 to color signals corresponding to the respective colors of red, green and blue, and the control circuit 5012 for converting the video signals to be inputted to a driver IC. The control circuit 5012 outputs signals to each of a scan line side and a signal line side. When performing digital drive, the signal dividing circuit 5013 may be provided on the signal line side so that the input digital signal is divided into m pieces of signals to be supplied.

Among the signals received at the tuner 5101, audio signals may be transmitted to the audio signal amplifying circuit 5105, and an output thereof is supplied to a speaker 5107 through an audio signal processing circuit 5106. A control circuit 5108 receives control data on a receiving station (receive frequency) and volume from an input portion 5109, and transmits the signal to the tuner 5101 and the audio signal processing circuit 5106.

Figure 21A:
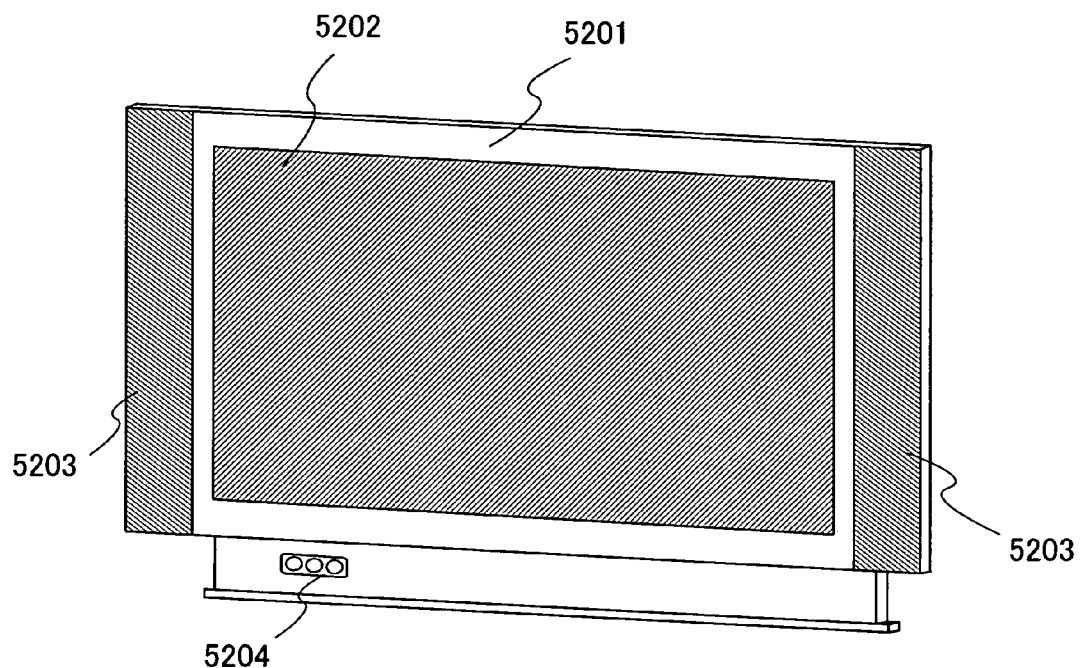
FIGS. 21A and 21B are diagrams showing examples of electronic appliances to which the present invention is applied.

As shown in FIG. 21A, a television receiver can be completed by incorporating an EL module into a housing 5201. A display screen 5202 is formed by the EL module. In addition, speakers 5203, an operating switch 5204, and the like are appropriately provided.

Figure 21B:
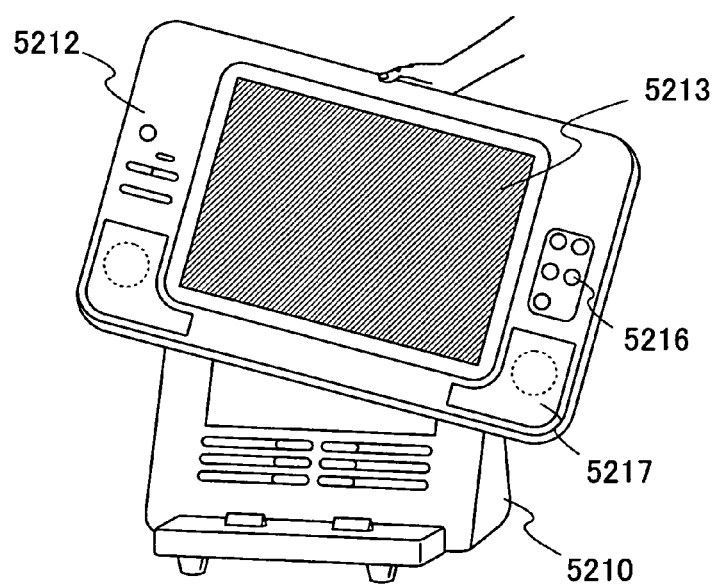

FIG. 21B shows a television receiver, which can receive signals wirelessly. Only a display of the television receiver is portable. A housing 5212 is incorporated with a battery and a signal receiver, and the battery drives a display portion 5213 and a speaker portion 5217. The battery can be repeatedly charged with a battery charger 5210. In addition, the battery charger 5210 can transmit and receive video signals, and transmit the video signals to a signal receiver of the display. The housing 5212 is controlled with an operating key 5216. The device shown in FIG. 21B can also transmit signals from the housing 5212 to the battery charger 5210 by operating the operating key 5216; therefore, it can also be called a video/audio two-way communication device. In addition, the device can also perform communication control of other electronic appliances by operating the operating key 5216 to transmit signals from the housing 5212 to the battery charger 5210 and further by controlling the other electronic appliances to receive signals that the battery charger 5210 can transmit; therefore, the device can also be called a general-purpose remote control device.

By applying semiconductor circuits serving as shift registers of the invention to a gate signal line driver circuit and a source signal line driver circuit of the television receiver shown in FIG. 19, FIG. 20, FIGS. 21A and 21B, the semiconductor circuits can properly serve as the shift registers even when amplitude of a clock signal is smaller than a potential difference between a high potential power source and a low potential power source, which drive the shift registers. Further, by using the semiconductor circuits serving as the shift registers of the present invention, power consumption can be reduced while preventing through current from flowing between the high potential power source and the low potential power source. Furthermore, by using the semiconductor circuits serving as the shift registers of the present invention, the number of transistors constituting the semiconductor circuits can be reduced as compared with a conventional shift register circuit, and therefore, high yield can be obtained. Moreover, by using the semiconductor circuits serving as the shift registers of the present invention, the semiconductor circuits can be operated without providing a level shift portion, so that an occupation area of the semiconductor circuits serving as the shift registers can be reduced. Consequently, a product displaying stable operation, a product with less defects, a product requiring less power can be provided to customers.

Needless to say, the present invention is not limited to a television receiver, and can be applied to various objects such as a monitor of a personal computer, an information display board at the train station or airport, or a large-area advertising display medium such as an advertising display board on the streets.

Figure 22A:
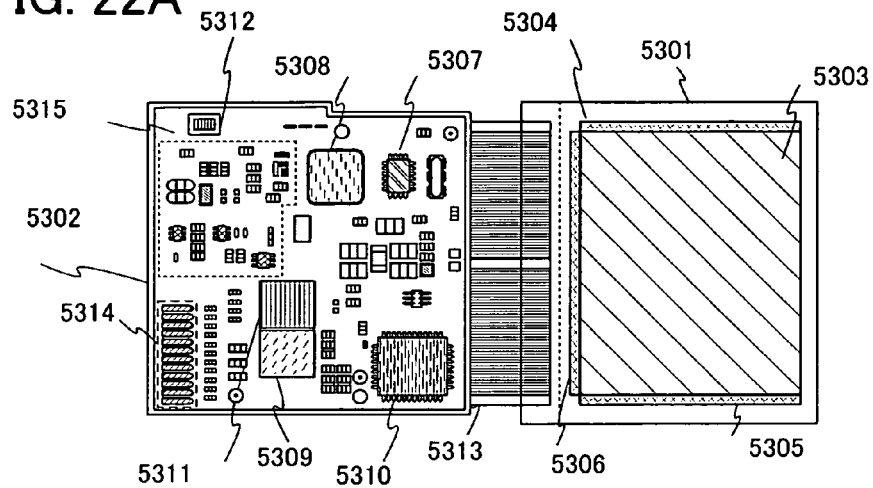
FIGS. 22A and 22B are diagrams showing examples of electronic appliances to which the present invention is applied.

FIG. 22A shows a module constructed by combining a display panel 5301 and a printed wiring board 5302. The display panel 5301 has a pixel portion 5303 where multiple pixels are provided, a first scanning line driver circuit 5304, a second scanning line driver circuit 5305, and a signal line driver circuit 5306 for supplying a video signal to a selected pixel.

The printed wiring board 5302 is provided with a controller 5307, a central processing unit (CPU) 5308, a memory 5309, a power supply circuit 5310, an audio processing circuit 5311, a transmission/reception circuit 5312, and the like. The printed wiring board 5302 and the display panel 5301 are connected through a flexible wiring board (FPC) 5313. The flexible wiring board 5313 may be provided with a capacitor element, a buffer circuit, and the like in order to prevent noise interruption on the power supply voltage or signals and also to prevent dull signal rising. In addition, the controller 5307, the audio processing circuit 5311, the memory 5309, the CPU 5308, the power supply circuit 5310 and the like can be mounted over the display panel 5301 by using a COG (chip on glass) method. By the COG method, a scale of the printed wiring board 5302 can be reduced.

Various control signals are input/output through an interface (I/F) portion 5314 provided on the printed wiring board 5302. In addition, an antenna port 5315 for transmitting/receiving signals to/from an antenna is provided on the printed wiring board 5302.

Figure 22B:
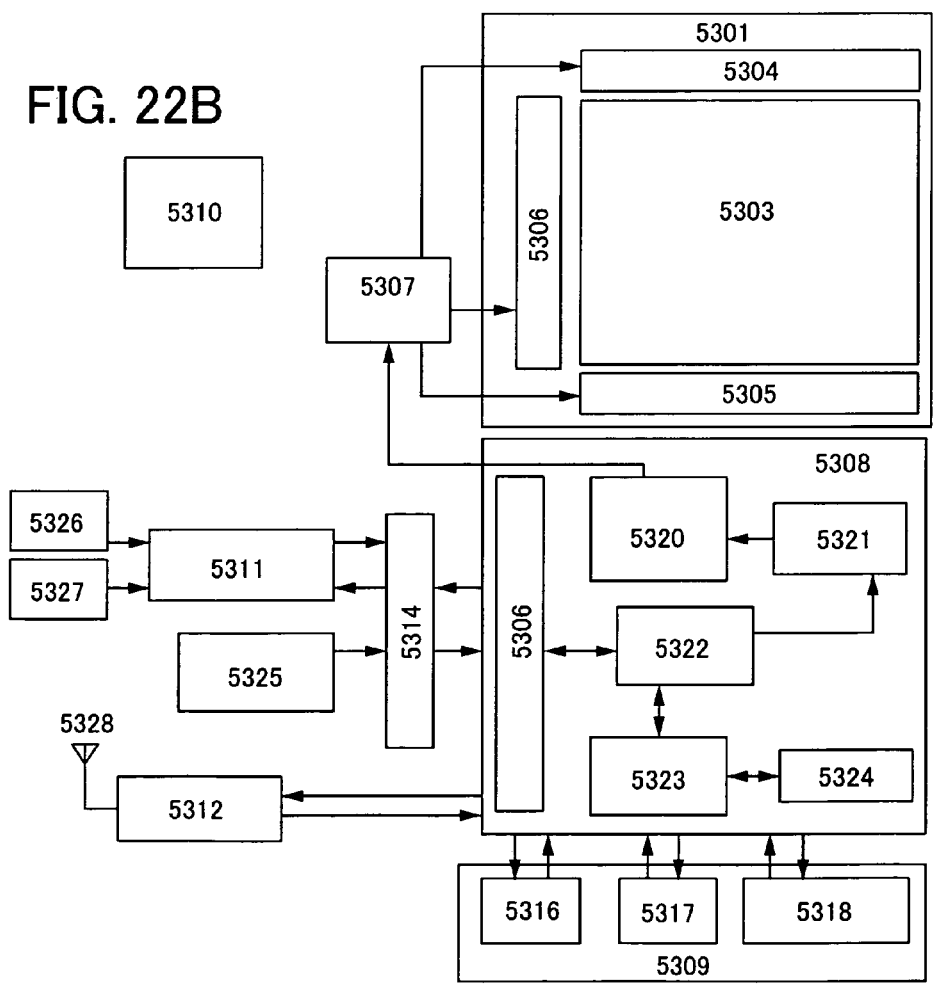

FIG. 22B is a block diagram of the module shown in FIG. 22A. This module includes a VRAM 5316, a DRAM 5317, a flash memory 5318, and the like as the memory 5309. The VRAM 5316 stores image data to be displayed on the panel, the DRAM 5317 stores image data or audio data, and the flash memory stores various programs.

The power supply circuit 5310 supplies power to operate the display panel 5301, the controller 5307, the CPU 5308, the audio processing circuit 5311, the memory 5309, and the transmission/reception circuit 5312. Depending on a specification of the panel, the power supply circuit 5310 may be provided with a current source.

The CPU 5308 includes a control signal generation circuit 5320, a decoder 5321, a register 5322, an arithmetic circuit 5323, a RAM 5324, an interface 5319 for the CPU 5308, and the like. Various signals input to the CPU 5308 through the interface 5319 are once stored in the register 5322 before input to the arithmetic circuit 5323, the decoder 5321, and the like. The arithmetic circuit 5323 performs operation based on the input signals, and specifies an address for sending various instructions. On the other hand, signals input to the decoder 5321 are decoded, and input to the control signal generation circuit 5320. The control signal generation circuit 5320 generates signals containing various instructions based on the input signals, and transmits them to an address specified in the arithmetic circuit 5323, specifically such as the memory 5309, the transmission/reception circuit 5312, the audio processing circuit 5311, the controller 5307, and the like.

The memory 5309, the transmission/reception circuit 5312, the audio processing circuit 5311, and the controller 5307 operate in accordance with the respective instructions received. The operation will be briefly described below.

Signals input from an input means 5325 are transmitted to the CPU 5308 mounted over the printed wiring board 5302 through the I/F portion 5314. The control signal generation circuit 5320 converts image data stored in the VRAM 5316 into a predetermined format in accordance with signals transmitted from the input means 5325 such as a pointing device and a keyboard, and then transmits the data to the controller 5307.

The controller 5307 performs data processing on signals containing image data that are transmitted from the CPU 5308 in accordance with the specification of the panel, and then supplies the data to the display panel 5301. In addition, the controller 5307 generates Hsync signals, Vsync signals, clock signals CLK, AC voltage (AC Cont), and switching signals L/R based on the power supply voltage input from the power supply circuit 5310 and the various signals input from the CPU 5308, and supplies them to the display panel 5301.

The transmission/reception circuit 5312 processes signals that have been transmitted/received as electromagnetic waves at an antenna 5328, and specifically includes high frequency circuits such as an isolator, a bandpass filter, a VCO (voltage controlled oscillator), an LPF (low pass filter), a coupler, and a balun. Among signals transmitted/received to/from the transmission/reception circuit 5312, signals containing audio data are transmitted to the audio processing circuit 5311 in accordance with the instruction from the CPU 5308.

The signals containing audio data that are transmitted in accordance with the instruction from the CPU 5308 are demodulated into audio signals in the audio processing circuit 5311 and then transmitted to a speaker 5327. Audio signals transmitted from a microphone 5326 are modulated in the audio processing circuit 5311, and then transmitted to the transmission/reception circuit 5312 in accordance with the instruction from the CPU 5308.

The controller 5307, the CPU 5308, the power supply circuit 5310, the audio processing circuit 5311, and the memory 5309 can be integrated as a package of this embodiment. This embodiment can be applied to any circuits except high frequency circuits such as an isolator, a bandpass filter, a VCO (voltage controlled oscillator), an LPF (low pass filter), a coupler, and a balun.

Figure 23:
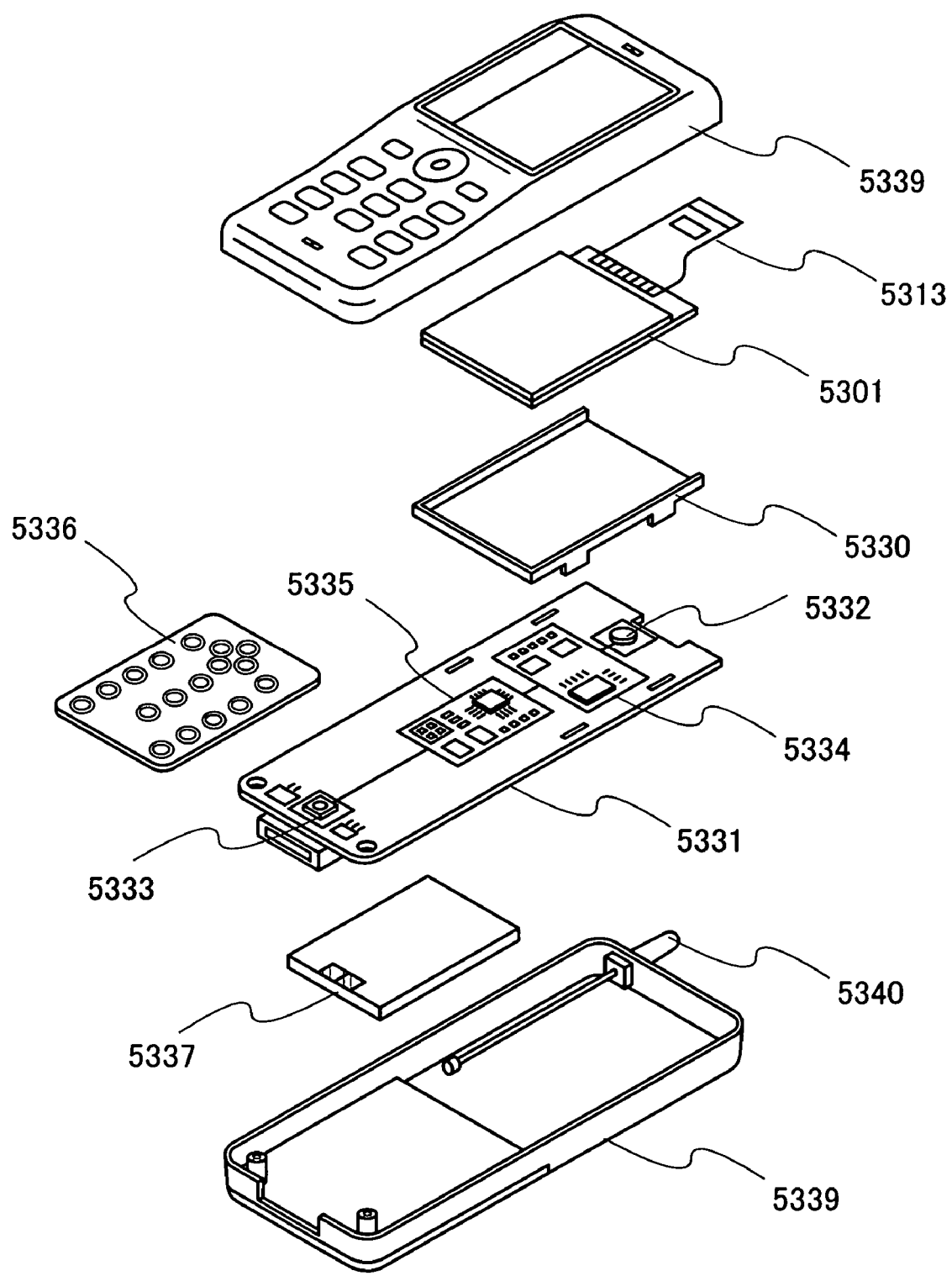
FIG. 23 is a diagram showing an example of an electronic appliance to which the present invention is applied.

FIG. 23 shows one mode of a portable phone including the module shown in FIGS. 22A and 22B. The display panel 5301 can be incorporated into a housing 5330 in an attachable/detachable manner. The shape and size of the housing 5330 can be appropriately changed in accordance with the size of the display panel 5301. The housing 5330 to which the display panel 5301 is fixed is fit into a printed board 5331 so as to be assembled as a module.

The display panel 5301 is connected to the printed board 5331 through an FPC 5313. On the printed board 5331, a speaker 5332, a microphone 5333, a transmission/reception circuit 5334, and a signal processing circuit 5335 including a CPU, a controller, and the like are formed. Such a module is combined with an input means 5336, a battery 5337, and an antenna 5340, and then incorporated into housings 5339. A pixel portion of the display panel 5301 is disposed so that it can be seen from an open window formed in the housing 5339.

The portable phone in accordance with this embodiment can be changed into various modes in accordance with the function or applications. For example, the portable phone may be constructed in such a manner that multiple display panels are used and a housing is appropriately divided into multiple units so as to enable folding/unfolding with a hinge.

In the portable phone shown in FIG. 23, a signal line driver circuit and a scanning line driver circuit of the display panel 5301 have the same semiconductor circuits as the semiconductor circuits described in Embodiment Modes. By using the semiconductor circuits, the semiconductor circuits can properly serve as shift registers even when amplitude of a clock signal is smaller than a potential difference between a high potential power source and a low potential power source, which drive the shift registers; power consumption can be reduced while preventing through current from flowing between the high potential power source and the low potential power source; the number of transistors constituting the semiconductor circuits can be reduced as compared with a conventional shift register circuit; and the semiconductor circuits can be operated without providing a level shift portion so that an occupation area of the semiconductor circuits serving as the shift registers can be reduced. Accordingly, a product displaying stable operation, a product with less defects, a product requiring less power, and a miniaturized product can be provided to customers. The display panel 5301 having these semiconductor circuits has also the same characteristics, so that this portable phone requires less power and displays stable operation. By utilizing these characteristics, a product (portable phone) displaying stable operation, a product (portable phone) with less defects, and a product (portable phone) requiring less power can be provided to customers. Therefore, it is possible to reduce power consumption, the size, and the weight of the housings 5339. The portable phone according to the present invention requires less power and is small and lightweight, and hence, a product with improved portability can be provided.

Figure 24A:
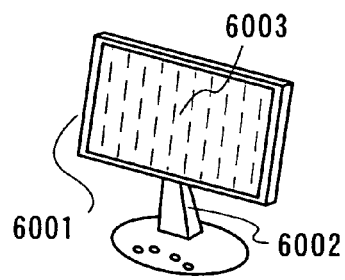
FIGS. 24A to 24E are diagrams showing examples of electronic appliances to which the present invention is applied.

FIG. 24A is a television device including a housing 6001, a supporting base 6002, a display portion 6003, and the like. In this television device, a signal line driver circuit and a scanning line driver circuit of the display portion 6003 have the same semiconductor circuits described in Embodiment Modes. By utilizing the semiconductor circuits, the semiconductor circuits can properly serve as shift registers even when amplitude of a clock signal is smaller than a potential difference between a high potential power source and a low potential power source, which drive the shift registers; power consumption can be reduced while preventing through current from flowing between the high potential power source and the low potential power source; the number of transistors constituting the semiconductor circuits can be reduced as compared with a conventional shift register circuit; and the semiconductor circuits can be operated without providing a level shift portion so that an occupation area of the semiconductor circuits serving as the shift registers can be reduced. Accordingly, a product displaying stable operation, a product with less defects, a product requiring less power, and a miniaturized product can be provided to customers. The display portion 6003 having these semiconductor circuits has also the same characteristics, so that this television device requires less power and displays stable operation. By utilizing these characteristics, a product (television device) displaying stable operation, a product (television device) with less defects, and a product (television device) requiring less power can be provided to customers. Therefore, it is possible to reduce power consumption, the size, and the weight of the housing 6001. The television device according to the present invention requires less power and is small and lightweight, and hence, a product with improved portability can be provided.

Figure 24B:
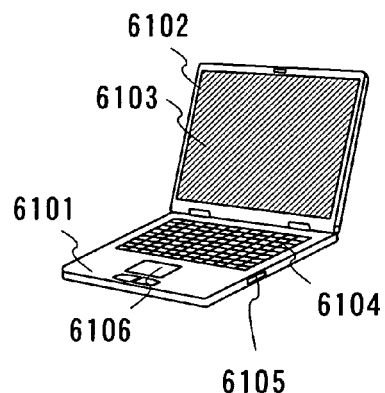

FIG. 24B is a computer including a main body 6101, a housing 6102, a display portion 6103, a keyboard 6104, an external connecting port 6105, a pointing mouse 6106, and the like. In this computer, a signal line driver circuit and a scanning line driver circuit of the display portion 6103 have the same semiconductor circuits described in Embodiment Modes. By utilizing the semiconductor circuits, the semiconductor circuits can properly serve as shift registers even when amplitude of a clock signal is smaller than a potential difference between a high potential power source and a low potential power source, which drive the shift registers; power consumption can be reduced while preventing through current from flowing between the high potential power source and the low potential power source; the number of transistors constituting the semiconductor circuits can be reduced as compared with a conventional shift register circuit; and the semiconductor circuits can be operated without providing a level shift portion so that an occupation area of the semiconductor circuits serving as the shift registers can be reduced. Accordingly, a product displaying stable operation, a product with less defects, a product requiring less power, and a miniaturized product can be provided to customers. The display portion 6103 having these semiconductor circuits has also the same characteristics, so that this computer requires less power and displays stable operation. By utilizing these characteristics, a product (computer) displaying stable operation, a product (computer) with less defects, and a product (computer) requiring less power can be provided to customers. Therefore, it is possible to reduce power consumption, the size, and the weight of the main body 6101 or the housing 6102. The computer according to the present invention requires less power and is small and lightweight, and hence, a product with improved portability can be provided.

Figure 24C:
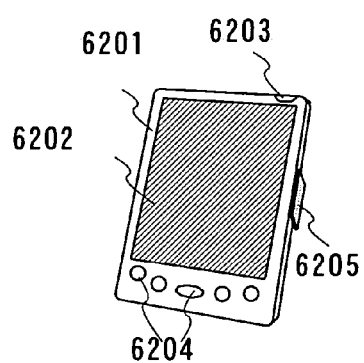

FIG. 24C is a portable computer including a main body 6201, a display portion 6202, a switch 6203, operating keys 6204, an infrared port 6205, and the like. In this portable computer, a signal line driver circuit and a scanning line driver circuit of the display portion 6202 have the same semiconductor circuits described in Embodiment Modes. By utilizing the semiconductor circuits, the semiconductor circuits can properly serve as shift registers even when amplitude of a clock signal is smaller than a potential difference between a high potential power source and a low potential power source, which drive the shift registers; power consumption can be reduced while preventing through current from flowing between the high potential power source and the low potential power source; the number of transistors constituting the semiconductor circuits can be reduced as compared with a conventional shift register circuit; and the semiconductor circuits can be operated without providing a level shift portion so that an occupation area of the semiconductor circuits serving as the shift registers can be reduced. Accordingly, a product displaying stable operation, a product with less defects, a product requiring less power, and a miniaturized product can be provided to customers. The display portion 6202 having these semiconductor circuits has also the same characteristics, so that this portable computer requires less power and displays stable operation. By utilizing these characteristics, a product displaying stable operation, a product with less defects, and a product requiring less power can be provided to customers. Therefore, it is possible to reduce the size and the weight of the main body 6201. The portable computer according to the present invention requires less power and is small and lightweight, and hence, a product with improved portability can be provided.

Figure 24D:
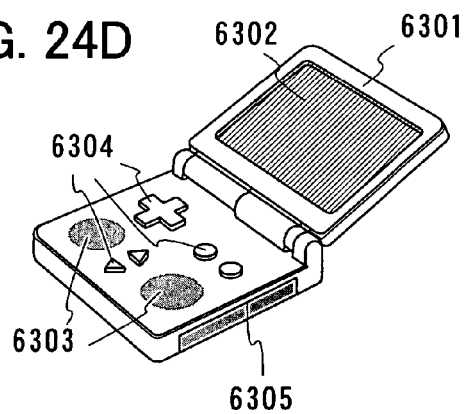

FIG. 24D is a portable game machine including a housing 6301, a display portion 6302, speaker portions 6303, operating keys 6304, a recording-medium insert socket 6305, and the like. In this portable game machine, a signal line driver circuit and a scanning line driver circuit of the display portion 6302 have the same semiconductor circuits described in Embodiment Modes. By utilizing the semiconductor circuits, the semiconductor circuits can properly serve as shift registers even when amplitude of a clock signal is smaller than a potential difference between a high potential power source and a low potential power source, which drive the shift registers; power consumption can be reduced while preventing through current from flowing between the high potential power source and the low potential power source; the number of transistors constituting the semiconductor circuits can be reduced as compared with a conventional shift register circuit; and the semiconductor circuits can be operated without providing a level shift portion so that an occupation area of the semiconductor circuits serving as the shift registers can be reduced. Accordingly, a product displaying stable operation, a product with less defects, a product requiring less power, and a miniaturized product can be provided to customers. The display portion 6302 having these semiconductor circuits has also the same characteristics, so that this portable game machine requires less power and displays stable operation. By utilizing these characteristics, a product displaying stable operation, a product with less defects, and a product requiring less power can be provided to customers. Therefore, it is possible to reduce the size and the weight of the housing 6301. The portable game machine according to the present invention requires less power and is small and lightweight, and hence, a product with improved portability can be provided.

Figure 24E:
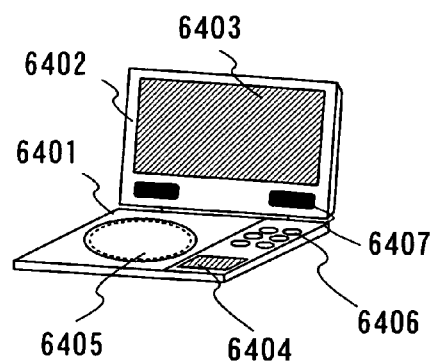
Figure 25:
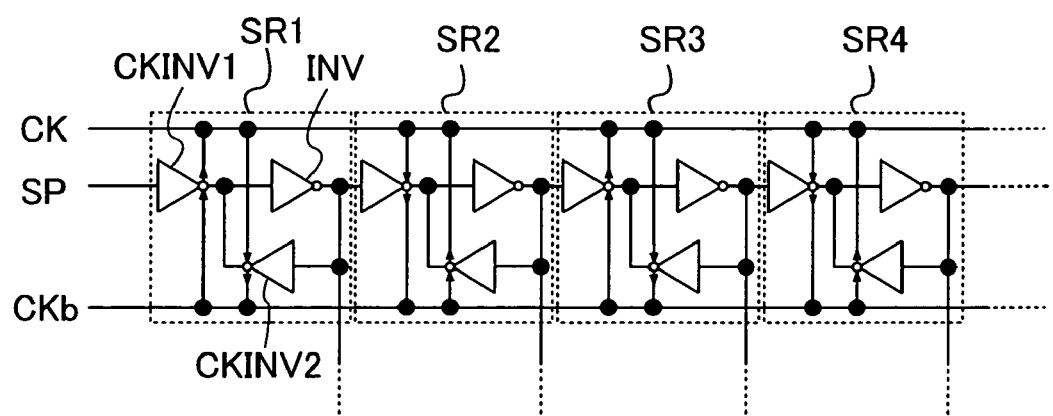
FIG. 25 is a circuit diagram showing a structure of a conventional example.
Figure 26:
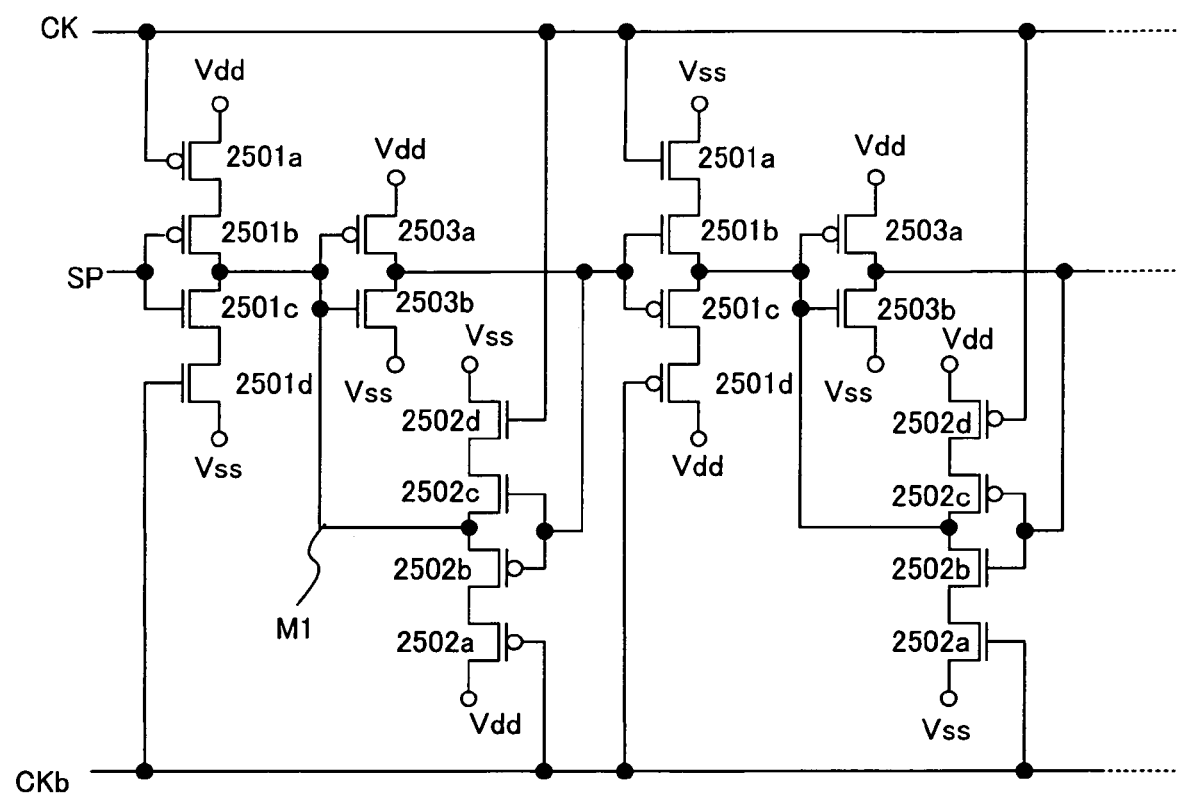
FIG. 26 is a circuit diagram showing the structure of the conventional example.
Figure 27:
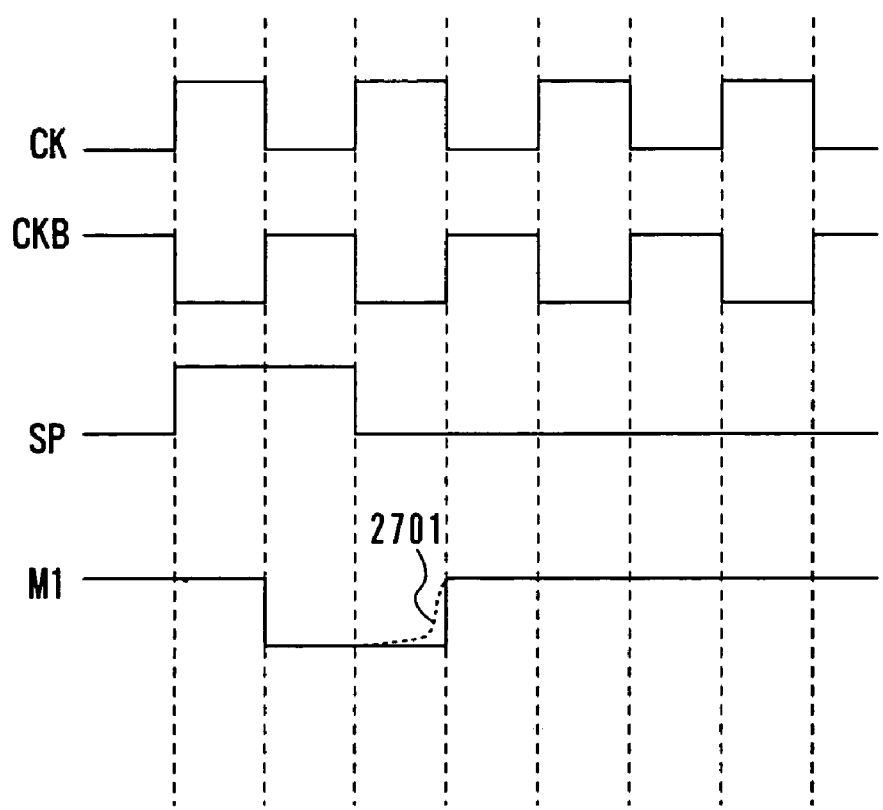
FIG. 27 is a timing chart of the structure of the conventional example.

FIG. 24E is a portable image reproducing device provided with a recording medium (specifically, a DVD reproducing device) including a main body 6401, a housing 6402, a display portion A6403, a display portion B6404, a recording medium (such as a DVD) reading portion 6405, an operating key 6406, a speaker portion 6407, and the like. The display portion A6403 mainly displays image data, and the display portion B6404 mainly displays text data. In this portable image reproducing device, a signal line driver circuit and a scanning line driver circuit of each of the display portion A6403 and the display portion B6404 have the same semiconductor circuits described in Embodiment Modes. By utilizing the semiconductor circuits, the semiconductor circuits can properly serve as shift registers even when amplitude of a clock signal is smaller than a potential difference between a high potential power source and a low potential power source, which drive the shift registers; power consumption can be reduced while preventing through current from flowing between the high potential power source and the low potential power source; the number of transistors constituting the semiconductor circuits can be reduced as compared with a conventional shift register circuit; and the semiconductor circuits can be operated without providing a level shift portion so that an occupation area of the semiconductor circuits serving as the shift registers can be reduced. Accordingly, a product displaying stable operation, a product with less defects, a product requiring less power, and a miniaturized product can be provided to customers. The display portion A6403 and the display portion B6404 having these semiconductor circuits have also the same characteristics, so that this portable image reproducing device requires less power and displays stable operation. By utilizing these characteristics, a product (image reproducing device) displaying stable operation, a product (image reproducing device) with less defects, and a product (image reproducing device) requiring less power can be provided to customers. Therefore, it is possible to reduce the size and the weight of the display portion A6403 and the display portion B6404. The portable image reproducing device according to the present invention requires less power and is small and lightweight, and hence, a product with improved portability can be provided.

Display devices used in such electronic appliances can be formed by using not only a glass substrate but also a heat-resistant plastic substrate in accordance with the size, strength or applications. Accordingly, even more reduction in weight can be achieved.

Note that examples shown in this embodiment are only exemplary, and therefore, the present invention is not limited to such applications.

This embodiment can be implemented by being freely combined with any of the aforementioned embodiment modes and embodiments.

This application is based on Japanese Patent Application Serial No. 2005-148814 filed in Japan Patent Office on May 20, 2005, the entire contents of which are hereby incorporated by reference.

What is claimed is:

1. A semiconductor circuit comprising:
   m (m is an arbitrary positive integer, $m \geq 3$) stages, each of the m stages comprising a circuit group and an inverter circuit,
   wherein the circuit group includes:
   a p-channel transistor having a first terminal connected to a first potential power source;
   a first n-channel transistor having a gate connected to a gate of the p-channel transistor and a first terminal connected to a second terminal of the p-channel transistor;
   a second n-channel transistor having a first terminal connected to a second terminal of the first n-channel transistor and a second terminal connected to a second potential power source; and an NAND circuit connected to the gate of the p-channel transistor, the gate of the first n-channel transistor, the second terminal of the p-channel transistor, and the first terminal of the first n-channel transistor, wherein an input terminal of the inverter circuit is connected to the second terminal of the p-channel transistor and the first terminal of the first n-channel transistor, wherein a clock signal is input to a gate of the second n-channel transistor in a (2n−1)th (n. is an arbitrary integer, m≧2n≧2) stage, and wherein an inverted clock signal is input to a gate of the second n-channel transistor in a 2n-th stage.

2. A semiconductor circuit according to claim 1, wherein a potential of the first potential power source is higher than a potential of the second potential power source.

3. A semiconductor circuit according to claim 1, further comprising a-means for holding a potential between the circuit group and the inverter circuit.

4. A semiconductor circuit according to claim 1, wherein the p-channel transistor, the first n-channel transistor, and the second n-channel transistor are thin film transistors formed on a glass substrate.

5. A semiconductor circuit according to claim 1, wherein the p-channel transistor, the first n-channel transistor, and the second n-channel transistor are formed on a single crystalline substrate.

6. A semiconductor circuit according to claim 1, wherein the semiconductor circuit is used for a shift register circuit.

7. A display device comprising the semiconductor circuit according to claim 1.

8. An electronic appliance comprising the display device according to claim 7.

9. The electronic appliance according to claim 8 is any one of a television receiver, a camera such as a video camera or a digital camera, a goggle type display, a navigation system, an audio reproducing device, a computer, a game machine, a mobile computer, a portable phone, a portable game machine, an electronic book, and an image reproducing device.

10. A display device comprising the semiconductor circuit according to claim 1 includes a liquid crystal element or an EL element.

11. A semiconductor circuit comprising:

m (m is an arbitrary positive integer, m≧3) stages, wherein each of the m stages comprising a first circuit group and a second circuit group, wherein the first circuit group includes:

a first p-channel transistor having a first terminal connected to a first potential power source;

a first n-channel transistor having a gate connected to a gate of the first p-channel transistor and a first terminal connected to a second terminal of the first p-channel transistor; and a second n-channel transistor having a first terminal connected to a second terminal of the first n-channel transistor and a second terminal connected to a second potential power source, wherein the second circuit group includes:

a second p-channel transistor having a first terminal connected to the first potential power source;

a third n-channel transistor having a gate connected to the second terminal of the first p-channel transistor, the first terminal of the first n-channel transistor, and a gate of the second p-channel transistor, and a first terminal connected to a second terminal of the second p-channel transistor; and a fourth n-channel transistor having a first terminal connected to a second terminal of the third n-channel transistor and a second terminal connected to the second potential power source, wherein a clock signal is input to a gate of the second n-channel transistor in a (2n−1)th (n is an arbitrary integer, m≧2n≧2) stage, and a gate of the fourth n-channel transistor in the (2n−1)th stage, and wherein an inverted clock signal is input to a gate of the second n-channel transistor in a 2n-th stage and a gate of the fourth n-channel transistor in the 2n-th stage.

12. A semiconductor circuit according claim 11, wherein a potential of the first potential power source is higher than a potential of the second potential power source.

13. A semiconductor circuit according to claim 11, wherein a high potential level of each of the clock signal and the inverted clock signal is the same as a potential of the first potential power source, and wherein a low potential level of each of the clock signal and the inverted clock signal is higher than a potential of the second potential power source.

14. A semiconductor circuit according to claim 11, further comprising a means for holding a potential between the first circuit group and the second circuit group.

15. A semiconductor circuit according to claim 11, further comprising an NOR circuit in which the gate of the first p-channel transistor and the gate of the first n-channel transistor are connected, and the second terminal of the second p-channel transistor and the first terminal of the third n-channel transistor are connected.

16. A semiconductor circuit according to claim 11, wherein the first to fourth n-channel transistors and the first and second p-channel transistors are thin film transistors formed on a glass substrate.

17. A semiconductor circuit according to claim 11, wherein the first to fourth n-channel transistors and the first and second p-channel transistors are formed on a single crystalline substrate.

18. A semiconductor circuit according to claim 11, wherein the semiconductor circuit is used for a shift register circuit.

19. A display device comprising the semiconductor circuit according to claim 11.

20. An electronic appliance comprising the display device according to claim 19.

21. The electronic appliance according to claim 20 is any one of a television receiver, a camera such as a video camera or a digital camera, a goggle type display, a navigation system, an audio reproducing device, a computer, a game machine, a mobile computer, a portable phone, a portable game machine, an electronic book, and an image reproducing device.

22. A display device comprising the semiconductor circuit according to claim 11 includes a liquid crystal element or an EL element.

* * * * *